(12) United States Patent
Amano

(10) Patent No.: US 11,069,546 B2
(45) Date of Patent: Jul. 20, 2021

(54) SUBSTRATE PROCESSING SYSTEM

(71) Applicant: Tokyo Electron Limited, Tokyo (JP)

(72) Inventor: Yoshifumi Amano, Koshi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 826 days.

(21) Appl. No.: 15/090,655

(22) Filed: Apr. 5, 2016

(65) Prior Publication Data
US 2016/0300734 A1 Oct. 13, 2016

(30) Foreign Application Priority Data

Apr. 8, 2015 (JP) .............................. JP2015-079183
Oct. 8, 2015 (JP) .............................. JP2015-200126

(51) Int. Cl.
*H01L 21/67* (2006.01)
*H01L 21/687* (2006.01)
*H01L 21/677* (2006.01)
*H01L 21/673* (2006.01)
*H01L 21/683* (2006.01)
(Continued)

(52) U.S. Cl.
CPC ...... *H01L 21/67178* (2013.01); *H01L 21/673* (2013.01); *H01L 21/67167* (2013.01); *H01L 21/67184* (2013.01); *H01L 21/67742* (2013.01); *H01L 21/67745* (2013.01); *H01L 21/6838* (2013.01); *H01L 21/68707* (2013.01); *B08B 1/002* (2013.01); *B08B 11/02* (2013.01)

(58) Field of Classification Search
CPC ............. H01L 21/67167; H01L 21/673; H01L 21/67742; H01L 21/67745; H01L 21/6838; H01L 21/67184
See application file for complete search history.

(56) References Cited

U.S. PATENT DOCUMENTS 6,436,267 B1 * 8/2002 Carl .................... H01L 21/2885
205/123
2006/0130750 A1 * 6/2006 Ishikawa ................ G03B 27/32
118/300
(Continued)

FOREIGN PATENT DOCUMENTS

CN 101164138 A 4/2008
CN 101246812 A 8/2008
(Continued)

*Primary Examiner* — Matthew J Song
(74) *Attorney, Agent, or Firm* — Pearne & Gordon LLP

(57) ABSTRACT

A substrate processing system includes a first processing block, a second processing block, and a reversing device. The first processing block includes a first processing unit configured to perform a process on a substrate with a first surface of the substrate facing upward, and a first transfer device configured to carry the substrate into/from the first processing unit. The second processing block includes a second processing unit configured to perform a process on the substrate with a second surface of the substrate, which is opposite to the first surface, facing upward, and a second transfer device configured to carry the substrate into/from the second processing unit. The reversing device is provided on a transfer path of the substrate from the first processing block to the second processing block, and is configured to reverse the substrate.

16 Claims, 20 Drawing Sheets

(51) Int. Cl.
*B08B 1/00* (2006.01)
*B08B 11/02* (2006.01)

(56) References Cited

U.S. PATENT DOCUMENTS

| | | | | |
|---|---|---|---|---|
| 2007/0147976 A1* | 6/2007 | Rice | ............... | G03F 7/70991 |
| | | | | 414/217 |
| 2008/0156351 A1* | 7/2008 | Mitsuyoshi | ....... | H01L 21/67742 |
| | | | | 134/15 |
| 2008/0170931 A1* | 7/2008 | Hashimoto | ....... | H01L 21/68707 |
| | | | | 414/225.01 |
| 2008/0235926 A1* | 10/2008 | Machida | ........... | H01L 21/67161 |
| | | | | 29/25.01 |
| 2009/0070946 A1 | 3/2009 | Tamada et al. | | |
| 2010/0221583 A1* | 9/2010 | Foad | ........................ | G11B 5/82 |
| | | | | 428/846 |
| 2011/0076120 A1* | 3/2011 | Itou | ................... | H01L 21/67225 |
| | | | | 414/222.13 |
| 2011/0078898 A1* | 4/2011 | Ishida | ............... | H01L 21/67051 |
| | | | | 29/771 |
| 2013/0078059 A1* | 3/2013 | Enokida | ............ | H01L 21/67178 |
| | | | | 414/222.13 |

FOREIGN PATENT DOCUMENTS

| | | |
|---|---|---|
| CN | 103021906 A | 4/2013 |
| JP | H10-247674 A | 9/1998 |
| JP | 2008-198882 A | 8/2008 |
| JP | 2008-251851 A | 10/2008 |
| JP | 2010-165741 A | 7/2010 |
| JP | 2013-021026 A | 1/2013 |
| TW | 200849349 A | 12/2008 |
| TW | 200915403 A | 4/2009 |
| WO | 2006/115745 A1 | 11/2006 |

* cited by examiner

SUBSTRATE PROCESSING SYSTEM

CROSS-REFERENCE TO RELATED APPLICATION

This application claims the benefit of Japanese Patent Application Nos. 2015-079183 and 2015-200126 filed on Apr. 8, 2015 and Oct. 8, 2015, respectively, the entire disclosures of which are incorporated herein by reference.

TECHNICAL FIELD

The embodiments described herein pertain generally to a substrate processing system.

BACKGROUND

Conventionally, in a manufacturing process of a semiconductor device, various kinds of processes such as an etching process, a cleaning process and a film forming process are performed on a substrate such as a semiconductor wafer.

Some of the processes upon the substrate are performed in a state where a front surface of the substrate faces upward, whereas some of the processes are performed in a state where a rear surface of the substrate faces upward. Thus, recently, there has been proposed a substrate processing system including both types of processing units, i.e., a processing unit configured to perform a process on a substrate with a front surface thereof facing upward and a processing unit configured to perform a process on a substrate with a rear surface thereof facing upward.

For example, Patent Document 1 describes a substrate processing system including a first processing apparatus configured to supply a cleaning liquid onto a front surface of a substrate with the front surface facing upward; a second processing apparatus configured to supply a cleaning liquid onto a rear surface of the substrate with the rear surface facing upward; a substrate reversing apparatus configured to reverse the front/rear surfaces of the substrate; and a substrate transfer device configured to carry-in/out the substrate while accessing the first processing apparatus, the second processing apparatus and the substrate reversing apparatus.

Patent Document 1: Japanese Patent Laid-open Publication No. 2013-021026

In the substrate processing system disclosed in Patent Document 1, however, since the substrate with the front surface facing upward and the substrate with the rear surface facing upward are provided together, management of the substrate states may be complicated.

SUMMARY

In view of the foregoing, exemplary embodiments provide a substrate processing system capable of suppressing management of front/rear surface states of substrates from being complicated when handling both a substrate with a front surface facing upward and a substrate with a rear surface facing upward.

In one exemplary embodiment, a substrate processing system includes a first processing block; a second processing block; and a reversing block. The first processing block includes a first processing unit configured to perform a process on a substrate with a first surface of the substrate facing upward; and a first transfer device configured to carry the substrate into/from the first processing unit. The second processing block includes a second processing unit configured to perform a process on the substrate with a second surface of the substrate, which is opposite to the first surface, facing upward; and a second transfer device configured to carry the substrate into/from the second processing unit. The reversing device is provided on a transfer path of the substrate from the first processing block to the second processing block, and is configured to reverse the substrate.

According to the exemplary embodiments, when handling both the substrate with the front surface facing upward and the substrate with the rear surface facing upward, it is possible to suppress the management of front/rear surface states of substrates from being complicated.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

DETAILED DESCRIPTION

Figure 1:
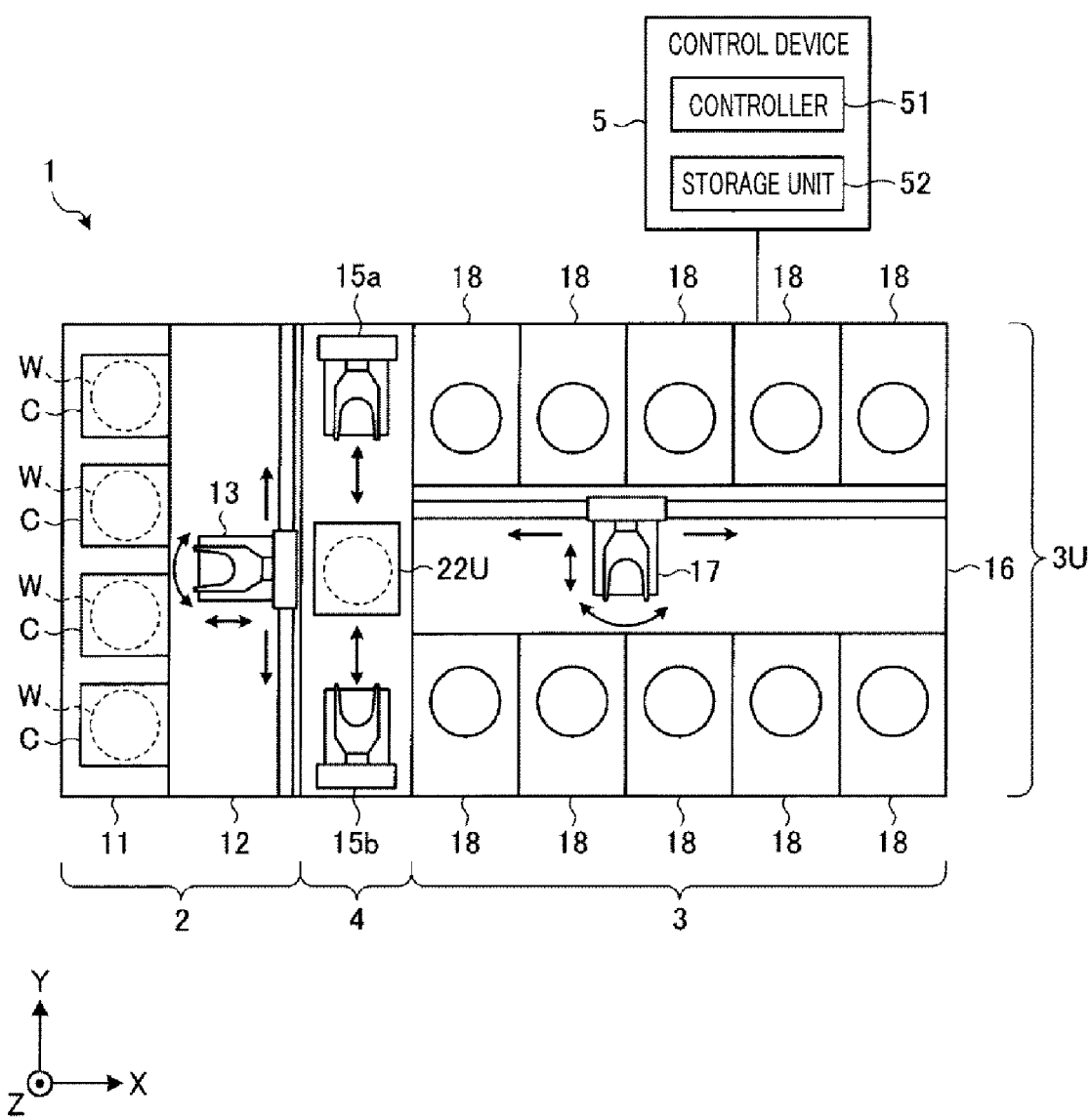
FIG. 1 is a schematic plan view of a substrate processing system according to a first exemplary embodiment.

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current exemplary embodiment. Still, the exemplary embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

Hereinafter, example embodiments of a substrate processing system will be explained in detail with reference to the accompanying drawings. Further, the present disclosure is not limited to the following example embodiments.

First Exemplary Embodiment

<Configuration of Substrate Processing System 1>

Figure 2:
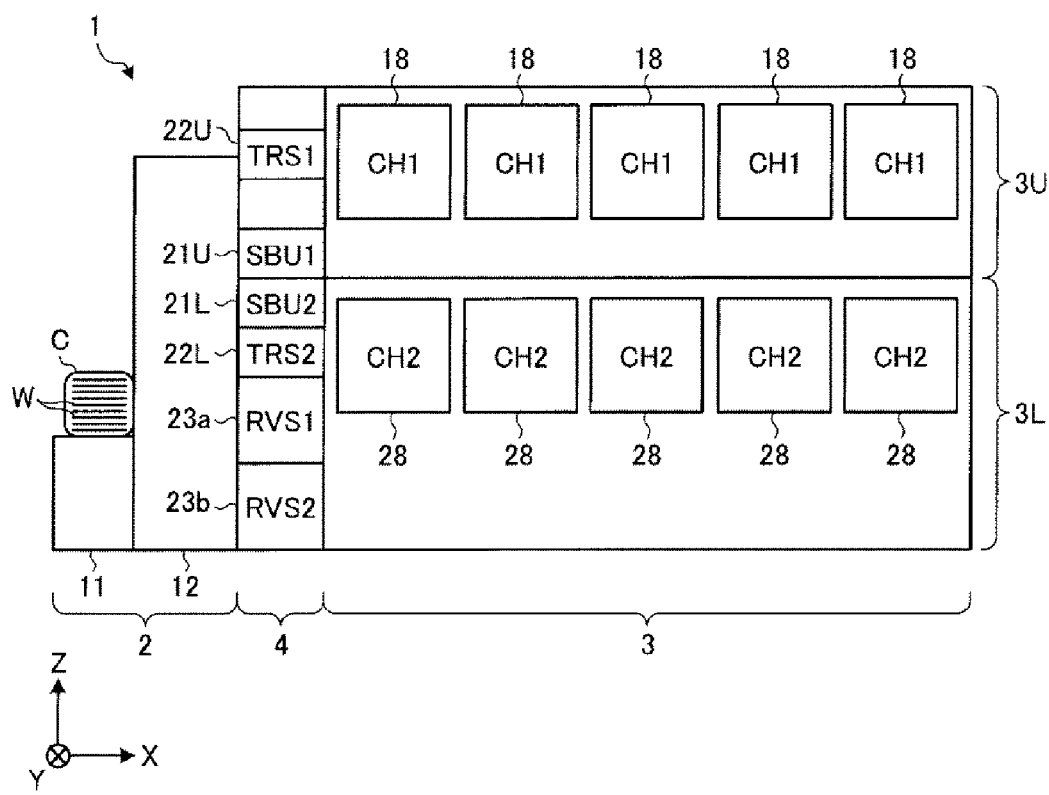
FIG. 2 is a schematic side view of the substrate processing system according to the first exemplary embodiment.

First, a configuration of a substrate processing system 1 according to a first exemplary embodiment will be described with reference to FIG. 1 and FIG. 2. FIG. 1 is a schematic plan view of the substrate processing system 1 according to the first exemplary embodiment. Further, FIG. 2 is a schematic side view of the substrate processing system 1 according to the first exemplary embodiment. Further, in the following description, in order to clarify positional relationships, the X-axis, Y-axis and Z-axis which are orthogonal to each other will be defined. The positive Z-axis direction will be regarded as a vertically upward direction.

As depicted in FIG. 1, the substrate processing system 1 according to the first exemplary embodiment includes a carry-in/out block 2, a processing block 3 and a delivery block 4. These blocks are arranged in the order of the carry-in/out block 2, the delivery block 4 and the processing block 3.

In the substrate processing system 1, a substrate, i.e., a semiconductor wafer (hereinafter, referred to as "wafer W") in the present exemplary embodiment is transferred from the carry-in/out block 2 into the processing block 3 via the delivery block 4, and then is processed in the processing block 3. Further, in the substrate processing system 1, the processed wafer W is returned back from the processing block 3 into the carry-in/out block 2 via the delivery block 4, and then is transferred from the carry-in/out block 2 to the outside. Hereinafter, configurations of the respective blocks 2 to 4 will be explained.

<Configuration of Carry-In/Out Block 2>

The carry-in/out block 2 includes a mounting unit 11 and a transfer unit 12. A plurality of cassettes C, each of which accommodates therein a multiple number of wafers W horizontally, is placed on the mounting unit 11.

The transfer unit 12 is positioned adjacent to the mounting unit 11 and is equipped with a main transfer device 13 therein. The main transfer device 13 is configured to transfer a wafer W between the mounting unit 11 and the delivery block 4.

<Configuration of Processing Block 3>

As depicted in FIG. 2, the processing block 3 includes a first processing block 3U and a second processing block 3L. The first processing block 3U and the second processing block 3L are spatially separated by a partition wall, a shutter, or the like, and are vertically arranged in a height direction. In the first exemplary embodiment, the first processing block 3U is arranged at the upper level, and the second processing block 3L is arranged at the lower level.

In the first processing block 3U, a wafer W with its circuit forming surface (hereinafter, referred to as "front surface") facing upward is processed. Meanwhile, in the second processing block 3L, a wafer W with the rear surface, which is opposite to the front surface, facing upward is processed. Below, configurations of the first processing block 3U and the second processing block 3L will be described.

<Configuration of First Processing Block 3U>

The first processing block 3U includes, as depicted in FIG. 1, a transfer unit 16, a first transfer device 17 and a multiple number of first processing units 18. The first transfer device 17 is provided within the transfer unit 16, and the multiple number of first processing units 18 are arranged adjacent to the transfer unit 16 at the outside of the transfer unit 16.

The first transfer device 17 is configured to transfer a wafer W between the delivery block 4 and the first processing unit 18. To elaborate, the first transfer device 17 takes out a wafer W from the delivery block 4 and transfers the wafer W into the first processing unit 18. Further, the first transfer device 17 also takes out the wafer W processed by the first processing unit 18 from the first processing unit 18 and transfers the processed wafer W into the delivery block 4.

The first processing unit 18 is configured to perform a bevel cleaning process on a wafer W with a front surface thereof facing upward. Here, the bevel cleaning process refers to a process of removing a boat mark, a particle adhering to a peripheral portion (bevel portion) of the wafer W, on which a circuit is not formed, or the like.

Figure 3:
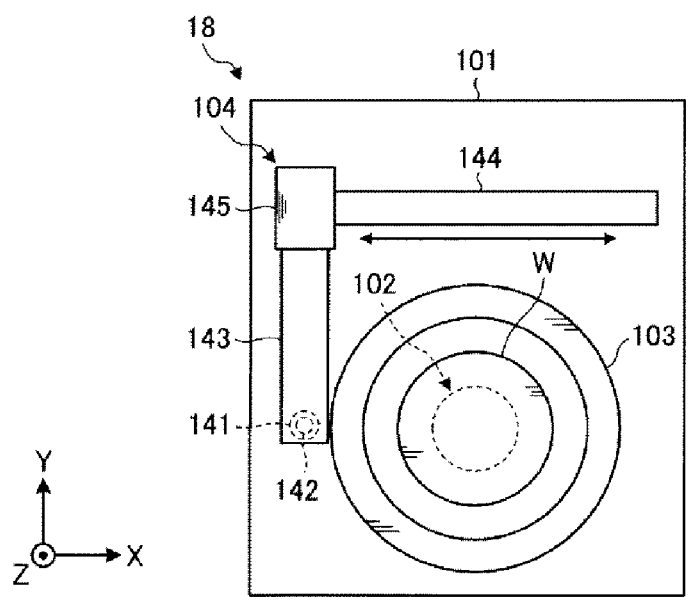
FIG. 3 is a schematic plan view of a first processing unit.

Here, a configuration of the first processing unit 18 will be explained with reference to FIG. 3 and FIG. 4. FIG. 3 is a schematic plan view of the first processing unit 18, and FIG. 4 is a schematic side view of the first processing unit 18.

Figure 4:
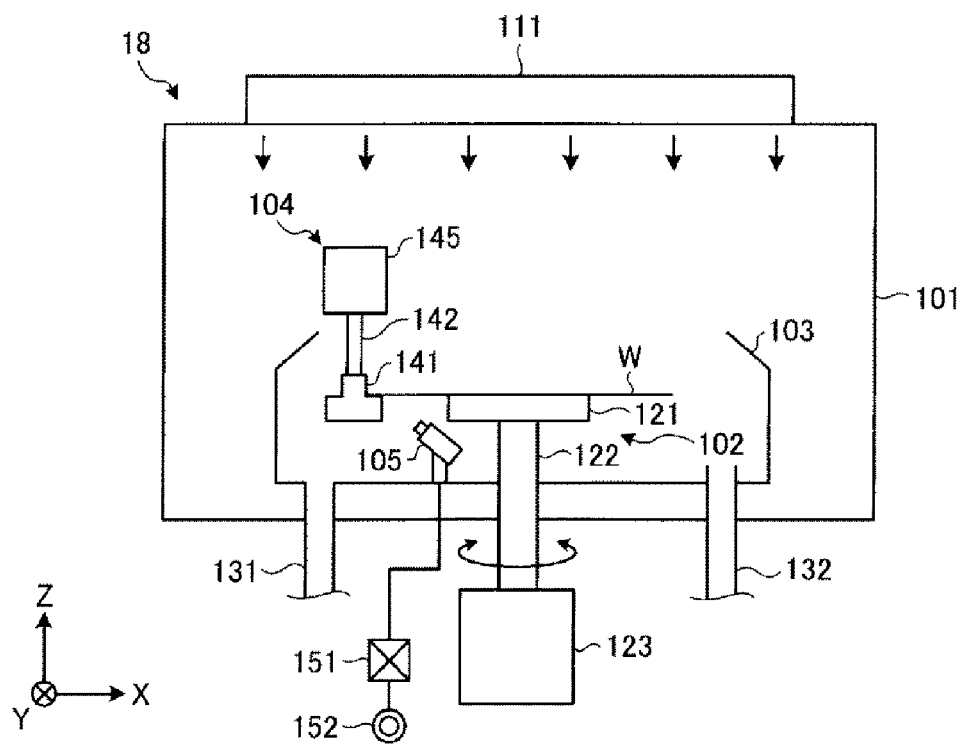
FIG. 4 is a schematic side view of the first processing unit.

As depicted in FIG. 3 and FIG. 4, the first processing unit 18 includes a first chamber 101, a first holding unit 102, a first recovery cup 103, a bevel cleaning unit 104 and a first discharging unit 105 (see FIG. 4).

The first chamber 101 accommodates therein the first holding unit 102, the first recovery cup 103, the bevel cleaning unit 104 and the first discharging unit 105. A FFU (Fan Filter Unit) 111 configured to form a downflow within the first chamber 101 is provided at a ceiling portion of the first chamber 101.

The first holding unit 102 includes an attracting/holding unit 121 configured to attract and hold a wafer W; a supporting column 122 configured to support the attracting/holding unit 121; and a driving unit 123 configured to rotate the supporting column 122.

The attracting/holding unit 121 is connected to a suction device (not shown) such as a vacuum pump, and is configured to hold the wafer W thereon horizontally by attracting a rear surface of the wafer W with a negative pressure which is generated through the suction of the suction device. The attracting/holding unit 121 may be implemented by, for example, a porous chuck. Further, the attraction mechanism may not be limited to the aforementioned example, and another attraction mechanism using, for example, an electrostatic chuck may be utilized.

The attracting/holding unit 121 has an attracting region having a diameter smaller than that of the wafer W. With this configuration, a bevel brush 141 of the bevel cleaning unit 104 to be described later can be brought into contact with the peripheral portion of the wafer W.

The supporting column 122 is provided under the attracting/holding unit 121 and is rotatably supported at the first chamber 101 and the first recovery cup 130 with bearings (not shown) therebetween. The driving unit 123 is provided under the supporting column 122 and is configured to rotate the supporting column 122 about a vertical axis thereof. With this configuration, the wafer W attracted and held by the attracting/holding unit 121 is rotated.

The first recovery cup 103 is disposed to surround the first holding unit 102, and a drain port 131 and an exhaust port 132 are provided in a bottom portion of the first recovery cup 103. A chemical liquid discharged from the first discharging unit 105 is drained out to the outside of the first chamber 101 through the drain port 131, and an atmosphere within the first chamber 101 is exhausted through the exhaust port 132.

The bevel cleaning unit 104 includes the bevel brush 141; an arm 143 extended in a horizontal direction (here, in the Y-axis direction) and configured to support the bevel brush 141 from above with a shaft 142 therebetween; and a moving device 145 configured to move the arm 143 in a horizontal direction (here, in the X-axis direction) along a rail 144. The moving device 145 is also configured to move the arm 143 in a vertical direction (Z-axis direction).

The first discharging unit 105 is provided at a bottom portion of the first recovery cup 103, for example, and is connected to a chemical liquid supply source 152 via a valve 151, a flow rate controller (not shown), and the like. The first discharging unit 105 is configured to discharge the chemical liquid supplied from the chemical liquid supply source 152 toward a peripheral portion of a rear surface of the wafer W. Here, by way of non-limiting example, SC1 (mixture of ammonia/hydrogen peroxide/water) may be used as the chemical liquid supplied from the chemical liquid supply source 152.

The first processing unit 18 is configured as described above, and rotates the wafer W in the state that the rear surface of the wafer W with the front surface facing upward is attracted and held by the attracting/holding unit 121. Further, the first processing unit 18 brings the bevel brush 141 of the bevel cleaning unit 104 into contact with the peripheral portion of the wafer W while discharging the chemical liquid toward the peripheral portion of the rear surface of the wafer W from the first discharging unit 105.

Thus, by performing the chemical cleaning with the chemical liquid and the physical cleaning with the bevel brush 141 together, it is possible to efficiently remove the particle, the boat mark, or the like. As stated above, the first processing unit 18 is configured not to supply the chemical liquid and not to perform the physical cleaning onto the circuit forming surface of the wafer W. Further, the bevel cleaning process may be applied to removing a film formed on the peripheral portion (bevel portion) of the wafer W, on which a circuit is not formed.

Furthermore, the first processing unit 18 may perform a rinse process of removing the chemical liquid remaining on the peripheral portion of the wafer W by supplying a rinse liquid such as pure water from the first discharging unit 105 after the bevel cleaning process is finished. Further, the first processing unit 18 dries the peripheral portion of the wafer W by rotating the wafer W after the rinse process is finished.

<Configuration of Second Processing Block 3L>

Figure 5:
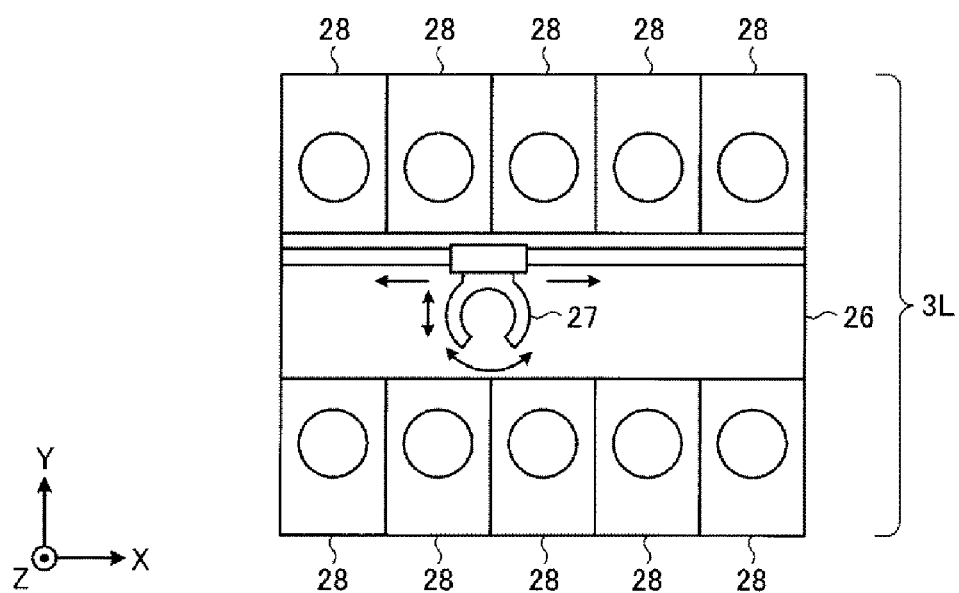
FIG. 5 is a schematic plan view of a second processing block.

Now, a configuration of the second processing block 3L will be discussed with reference to FIG. 5. FIG. 5 is a schematic plan view of the second processing block 3L.

As depicted in FIG. 5, the second processing block 3L includes a transfer unit 26, a second transfer device 27, and a multiple number of second processing units 28. The second transfer device 27 is provided within the transfer unit 26, and the multiple number of second processing units 28 are arranged adjacent to the transfer unit 26 at the outside of the transfer unit 26.

The second transfer device 27 is configured to transfer a wafer W between the delivery block 4 and the second processing unit 28. To elaborate, the second transfer device 27 takes out a wafer W from the delivery block 4 and transfers the wafer W into the second processing unit 28. Further, the second transfer device 27 also takes out the wafer W processed by the second processing unit 28 from the second processing unit 28 and transfers the processed wafer W into the delivery block 4.

Figure 6:
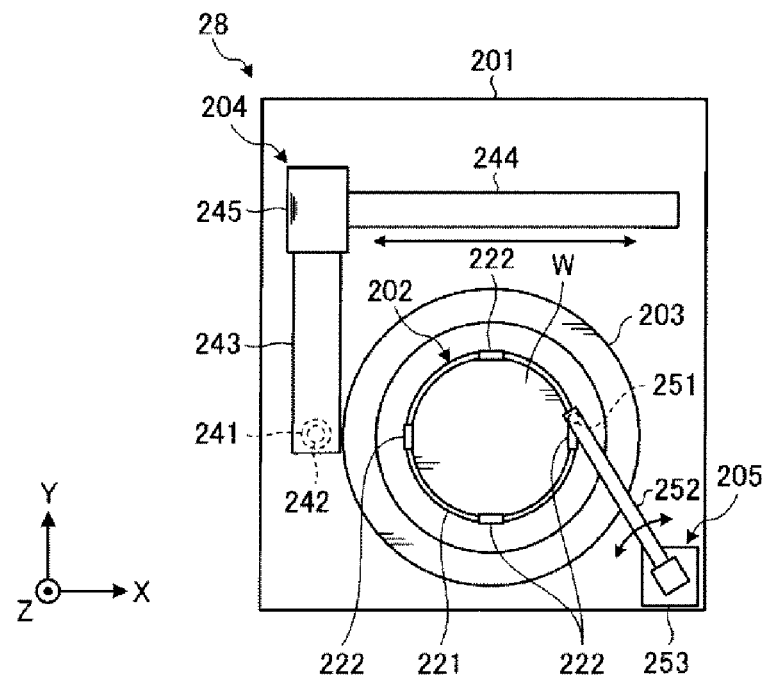
FIG. 6 is a schematic plan view of a second processing unit.

The second processing unit 28 is configured to perform a rear surface cleaning process of removing a particle or the like adhering to a rear surface of the wafer W with the rear surface facing upward. Here, a configuration of the second processing unit 28 will be explained with reference to FIG. 6 and FIG. 7. FIG. 6 is a schematic plan view of the second processing unit 28, and FIG. 7 is a schematic side view of the second processing unit 28.

Figure 7:
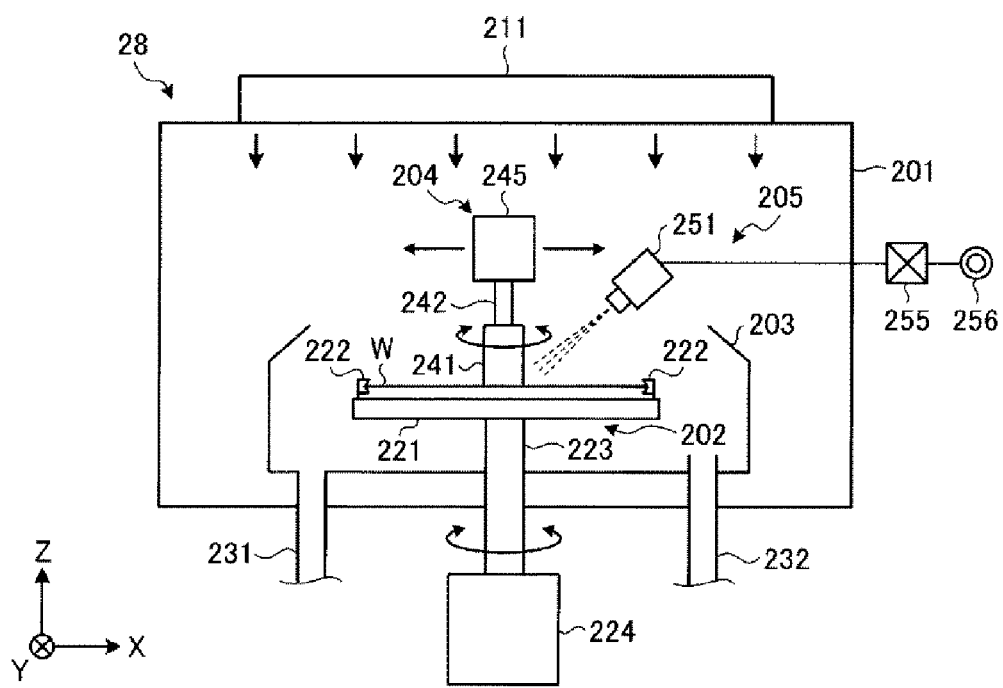
FIG. 7 is a schematic side view of the second processing unit.

As depicted in FIG. 6 and FIG. 7, the second processing unit 28 includes a second chamber 201, a second holding unit 202, a second recovery cup 203, a rear surface cleaning unit 204 and a second discharging unit 205.

The second chamber 201 accommodates therein the second holding unit 202, the second recovery cup 203, the rear surface cleaning unit 204 and the second discharging unit 205. A FFU (Fan Filter Unit) 211 configured to form a downflow within the second chamber 201 is provided at a ceiling portion of the second chamber 201.

The second holding unit 202 includes a main body 221 having a diameter larger than that of the wafer W; a plurality of grippers 222 provided on a top surface of the main body 221; a supporting column 223 configured to support the main body 221; and a driving unit 224 configured to rotate the supporting column 223.

The second holding unit 202 having this configuration holds the wafer W thereon by gripping a peripheral portion of the wafer W with the plurality of grippers 222. Accordingly, the wafer W is horizontally maintained slightly spaced apart from the top surface of the main body 221.

Furthermore, in the second processing unit 28, the rear surface cleaning process is performed on the wafer W with the rear surface facing upward, i.e., with the front surface facing downward. Thus, if a wafer holding structure configured to attract the wafer W, like the first holding unit 102 (see FIG. 4), is applied to the second processing unit 28, the front surface of the wafer W which serves as the circuit forming surface may be contaminated. Thus, in the substrate processing system 1, to suppress contamination of the circuit forming surface, the second holding unit 202 is configured to grip the peripheral portion of the wafer W.

The second recovery cup 203 is disposed to surround the second hold unit 202. A drain port 231 and an exhaust port 232, which are the same as those of the first recovery cup 103, are provided in a bottom portion of the second recovery cup 203.

The rear surface cleaning unit 204 includes a rear surface brush 241; an arm 243 extended in the horizontal direction (here, in the Y-axis direction) and configured to support the rear surface brush 241 from above with a shaft 242 therebetween; and a moving device 245 configured to move the arm 243 in the horizontal direction (here, in the X-axis direction) along a rail 244. The moving device 245 is also configured to move the arm 243 in the vertical direction (Z-axis direction). Furthermore, the rear surface cleaning unit 204 is equipped with a non-illustrated rotating device. By using this rotating device, the rear surface brush 241 can be rotated around the shaft 242.

The second discharging unit 205 is disposed outside the second recovery cup 203. The second discharging unit 205 includes a nozzle 251; an arm 252 extended horizontally and configured to support the nozzle 251; and a rotating/elevating device 253 configured to rotate and move the arm 252 up and down.

As depicted in FIG. 7, the nozzle 251 is connected to a cleaning liquid supply source 256 via a valve 255, a flow rate controller (not shown), and the like. The second discharging unit 205 is configured to discharge a cleaning liquid supplied from the cleaning liquid supply source 256 toward the wafer W. The cleaning liquid supplied from the cleaning liquid supply source 256 may be, by way of example, but not limitation, pure water. Further, a chemical liquid (e.g., SC-1) may also be used as the cleaning liquid.

The second processing unit 28 is configured as described above, and rotates the wafer W with the rear surface facing upward while holding the peripheral portion of the wafer W by the second holding unit 202. Subsequently, the second processing unit 28 brings the rear surface brush 241 of the rear surface cleaning unit 204, which is disposed above the wafer W being rotated, into contact with the wafer W. Further, the second discharging unit 28 discharges the cleaning liquid toward the wafer W from the second discharging unit 205 disposed above the wafer W being rotated. Then, the second processing unit 28 moves the rear surface brush 241 from a central portion of the wafer W toward the peripheral portion thereof, for example, while rotating the rear surface brush 241. Accordingly, the particle or the like adhering to the entire rear surface of the wafer W is removed.

<Configuration of Delivery Block 4>

Now, the delivery block 4 will be elaborated. As illustrated in FIG. 1 and FIG. 2, the delivery block 4 incorporates therein a plurality of delivery devices 15a and 15b, a first buffer unit 21U, a second buffer unit 21L, a first transit unit 22U, a second transit unit 22L, a first reversing device 23a and a second reversing device 23b.

The first buffer unit 21U, the second buffer unit 21L, the first transit unit 22U, the second transit unit 22L, the first reversing device 23a and the second reversing device 23b are vertically arranged in a height direction. To elaborate, these units are arranged in the order of the first transit unit 22U, the first buffer unit 21U, the second buffer unit 21L, the second transit unit 22L, the first reversing device 23a and the second reversing device 23b in sequence from the top.

Each of the delivery devices 15a and 15b includes a non-illustrated elevating device. By being moved in the vertical direction through the elevating device, each delivery devices 15a and 15b carries a wafer W into and out of the first transit unit 22U or other units, which are vertically arranged in the height direction. The delivery device 15a is configured to access the first transit unit 22U and the like from the positive Y-axis direction of the first transit unit 22U and the like, whereas the delivery device 15b is configured to access the first transit unit 22U and the like from the negative Y-axis direction of the first transit unit 22U and the like.

Each of the first buffer unit 21U, the second buffer unit 21L, the first transit unit 22U and the second transit unit 22L is a module configured to accommodate therein wafers W in multiple levels. Among these modules, the first buffer unit 21U and the second buffer unit 21L are accessed by the main transfer device 13 and the delivery devices 15a and 15b.

Figure 8:
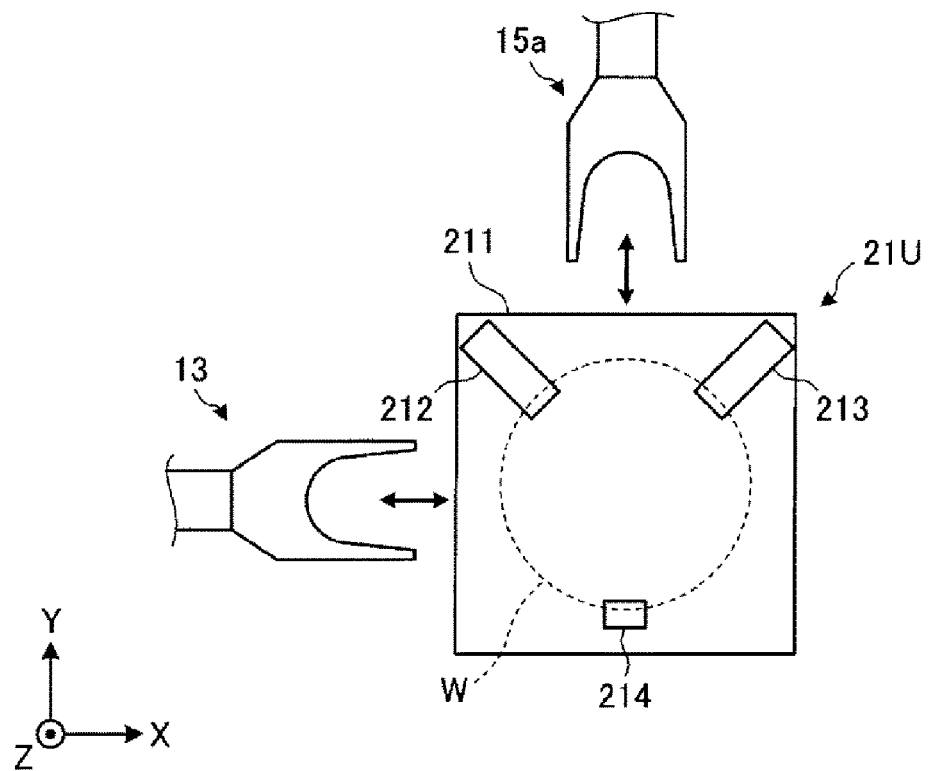
FIG. 8 is a diagram illustrating a configuration of a first buffer unit.
Figure 9:
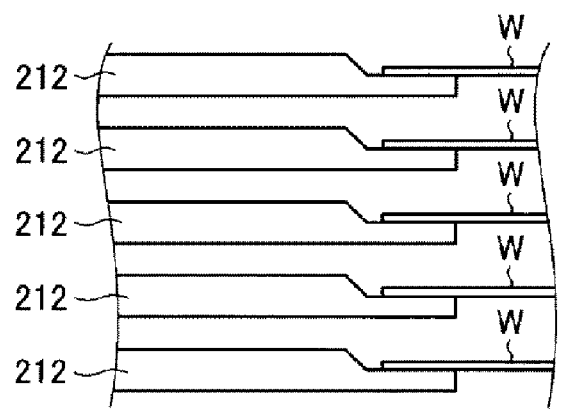
FIG. 9 is a diagram illustrating the configuration of the first buffer unit.

Here, configurations of the first buffer unit 21U and the second buffer unit 21L will be explained with reference to FIG. 8 and FIG. 9. FIG. 8 and FIG. 9 are diagrams illustrating a configuration of the first buffer unit 21U. Though FIG. 8 illustrates the configuration of the first buffer unit 21U as an example, the second buffer unit 21L has the same configuration as that of the first buffer unit 21U.

As depicted in FIG. 8, the first buffer unit 21U includes a base member 211, and three supporting members 212, 213 and 214 uprightly standing on the base member 211. The three supporting members 212, 213 and 214 are arranged spaced apart from each other at an angular interval of about 120 degrees and respectively support a peripheral portion of a wafer W on leading ends thereof. Further, each of the supporting members 212, 213 and 214 is plural in number, and they are arranged in the height direction (for example, see a plurality of supporting members 212 illustrated in FIG. 9). With this configuration, the first buffer unit 21U is capable of accommodating a plurality of wafers W in multiple levels.

The main transfer device 13 and the delivery device 15a access the first buffer unit 21U from different directions. To elaborate, the main transfer device 13 advances into the first buffer unit 21U through a space between the supporting member 212 and the supporting member 214 from the negative X-axis direction of the first buffer unit 21U. Further, the delivery device 15a advances into the first buffer unit 21U through a space between the supporting member 212 and the supporting member 213 from the positive Y-axis direction of the first buffer unit 21U.

Each of the first buffer unit 21U and the second buffer unit 21L accommodates therein wafers W with the front surfaces facing upward.

The first transfer device 17 and the delivery devices 15a and 15b are capable of accessing the first transit unit 22U. The first transit unit 22U accommodates therein the wafer W to be carried into the first processing block 3U from the delivery block 4 or the wafer W carried back into the delivery block 4 from the first processing block 3U. Further, the first transit unit 22U accommodates the wafer W therein with the front surface facing upward. The first transit unit 22U is disposed at a position accessible (allowed to be accessed) by the first transfer device 17, specifically, a position adjacent to the transfer unit 16 of the first processing block 3U.

The second transfer device 27 and the delivery devices 15a and 15b are configured to access the second transit unit 22L. The second transit unit 22L accommodates therein the wafer W to be carried into the second processing block 3L from the delivery block 4 or the wafer W carried back into the delivery block 4 from the second processing block 3L. The second transit unit 22L accommodates therein the wafer W with the rear surface facing upward. The second transit unit 22L is disposed at a position accessible by the second transfer device 27, specifically, a position adjacent to the transfer unit 26 of the second processing block 3L.

The first reversing device 23a and the second reversing device 23b are configured to reverse the front/rear surfaces of the wafer W. In the present exemplary embodiment, the first reversing device 23a is configured to reverse the wafer W with the front surface facing upward, and the second reversing device 23b is configured to reverse the wafer W with the rear surface facing upward. However, regarding which state of wafer W is reversed by the reversing devices 23a and 23b, the exemplary embodiment is not limited to the aforementioned example.

As stated above, in the substrate processing system 1 according to the first exemplary embodiment, the first processing units 18, each of which is configured to perform a process on the wafer W with the front surface facing upward, are provided in the first processing block 3U, and the second processing units 28, each of which is configured to perform a process on the wafer W with the rear surface facing upward, are provided in the second processing block 3L which is spatially separated from the first processing block 3U. Furthermore, in the substrate processing system 1 according to the first exemplary embodiment, the reversing devices 23a and 23b, each of which is configured to reverse the front/rear surfaces of the wafer W, are provided in the delivery block 4 which is on a transfer path of the wafer W from the first processing block 3U to the second processing block 3L.

With the above-described configuration, the first processing block 3U is configured to handle only the wafer W with the front surface facing upward, and the second processing block 3L is configured to handle only the wafer W with the rear surface facing upward. That is, in any of the first processing block 3U and the second processing block 3L, it is possible to suppress the wafer W with the front surface facing upward and the wafer W with the rear surface facing upward from being provided together. Therefore, according to the substrate processing system 1 of the first exemplary embodiment, the management of front/rear surface states of wafers W may not be complicated.

<Configuration of Control Device 5>

The substrate processing system 1 includes a control device 5 (see FIG. 1). The control device 5 is, for example, a computer, and includes a controller 51 and a storage unit 52. The storage unit 52 stores therein a program for controlling various kinds of processes performed in the substrate processing system 1. The controller 51 is implemented by, for example, a CPU (Central Processing Unit) and controls an overall operation of the substrate processing system 1 by reading and executing the program stored in the storage unit 52.

Further, this program may be recorded on a computer-readable recording medium and installed in the storage unit 52 of the control device 5 from the recording medium. The computer-readable recording medium may include, but not limited to, a hard disk (HD), a flexible disk (FD), a compact disk (CD), a magneto-optical disk (MO), and a memory card. Further, the controller 51 may only be composed of hardware without using a program.

<Configuration of Transfer Mechanism>

Figure 10:
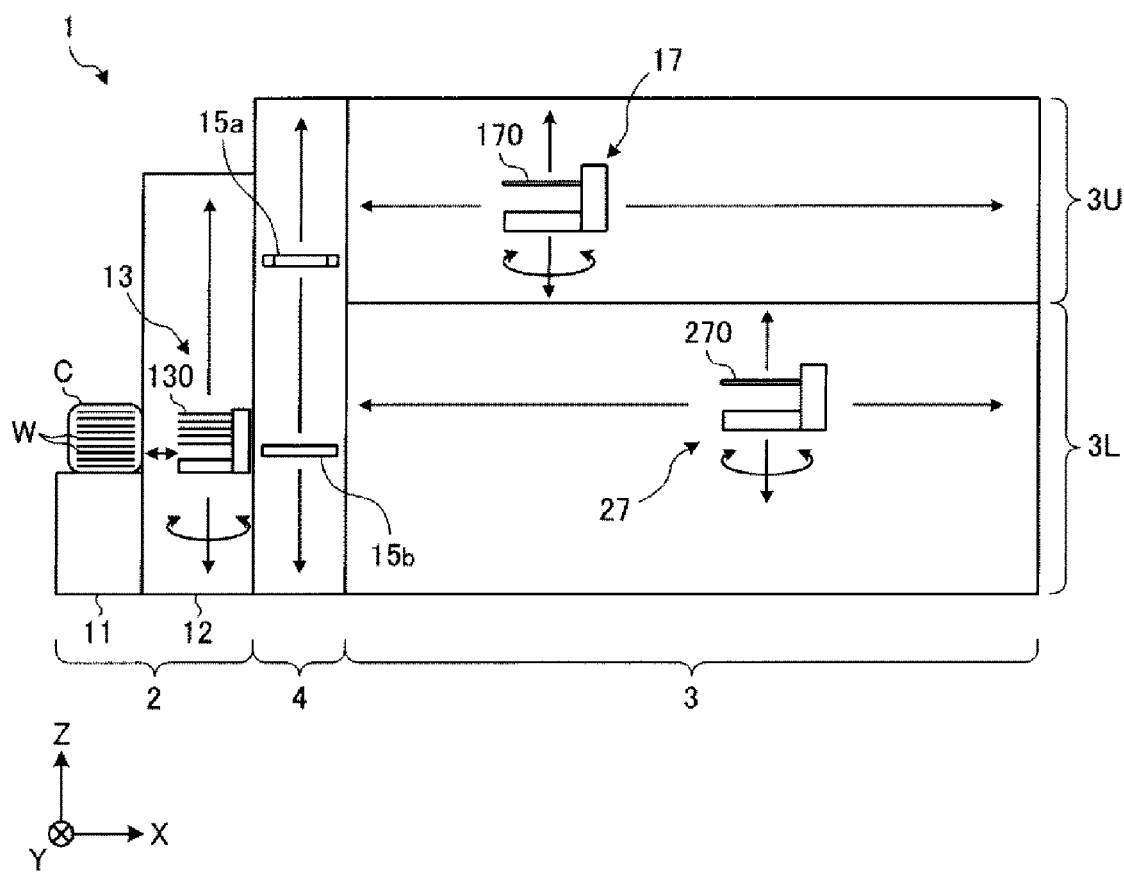
FIG. 10 is a diagram illustrating a layout of a main transfer device, delivery devices, a first transfer device, and a second transfer device.

Now, a configuration of a transfer mechanism of the substrate processing system 1, that is, the main transfer device 13, the delivery devices 15a and 15b, the first transfer device 17 and the second transfer device 27 will be explained with reference to FIG. 10. FIG. 10 is a diagram illustrating a layout of the main transfer device 13, the delivery devices 15a and 15b, the first transfer device 17 and the second transfer device 27.

As depicted in FIG. 10, the main transfer device 13 includes a multiple number of (here, five) wafer holders 130 configured to hold wafers W thereon. The main transfer device 13 is configured to be movable in the horizontal direction and in the vertical direction, and rotatable around the vertical axis thereof. The main transfer device 13 is capable of transferring a multiple number of wafers W at the same time between the cassette C and the first and second buffer units 21U and 21L by using the wafer holders 130.

The delivery devices 15a and 15b are configured to carry wafers W into and from the first buffer unit 21U, the second buffer unit 21L, the first transit unit 22U, the second transit unit 22L, the first reversing device 23a and the second reversing device 23b, as stated above.

The first transfer device 17 and the second transfer device 27 are configured to be movable in the horizontal direction and in the vertical direction. The first transfer device 17 transfers a wafer W between the first transit unit 22U and the first processing unit 18 by using a wafer holder 170, and the second transfer device 27 transfers a wafer W between the second transit unit 22L and the second processing unit 28 by using a wafer holder 270.

Figure 11:
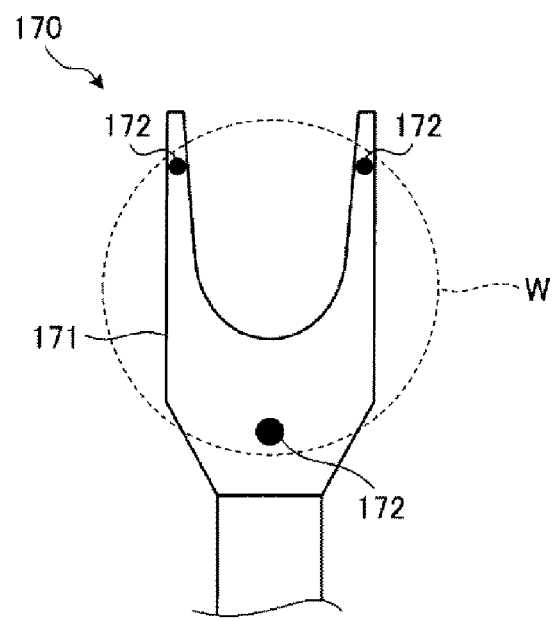
FIG. 11 is a schematic plan view illustrating a wafer holder of the first transfer device.
Figure 12:
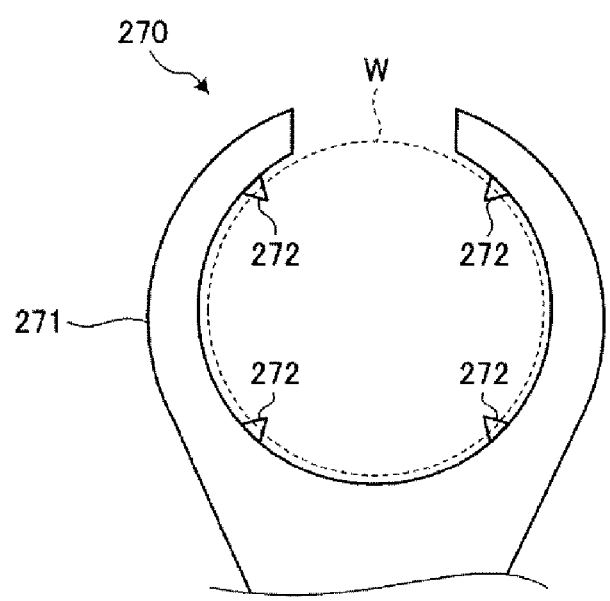
FIG. 12 is a schematic plan view illustrating a wafer holder of the second transfer device.

Here, configurations of the wafer holders 170 and 270 belonging to the first transfer device 17 and the second transfer device 27, respectively, will be described with reference to FIG. 11 and FIG. 12. FIG. 11 is a schematic plan view of the wafer holder 170 of the first transfer device 17. FIG. 12 is a schematic plan view of the wafer holder 270 of the second transfer device 27.

As depicted in FIG. 11, the wafer holder 170 of the first transfer device 17 includes a main body 171 having a bifurcated leading end; and a plurality of attracting members 172 provided on a top surface of the main body 171 and configured to attract a wafer W thereon. For example, the attracting members 172 are respectively provided at a base end portion of the main body 171 and two branched-portions of the leading end of the main body 171. Each attracting member 172 is connected to a suction device (not shown) such as a vacuum pump and attracts the wafer W by a negative pressure generated through the suction of the suction device.

The wafer holder 170 holds the wafer W by attracting the rear surface of the wafer W by using the attracting members 172. With this configuration, the wafer holder 170 is capable of suppressing a position deviation of the wafer W while transferring the wafer W.

In the first processing unit 18, the bevel cleaning process as described above is performed. Here, if a position of the wafer W is deviated when the bevel cleaning process is performed, it is difficult to appropriately bring the bevel brush 141 into contact with the peripheral portion of the wafer W. Thus, when performing the bevel cleaning process, it is desirable that the center of the wafer W coincides with a rotation center of the first holding unit 102.

The position deviation of the wafer W may occur while transferring the wafer W. To solve this problem, it may be considered that, before starting the bevel cleaning process, the position deviation of the wafer W caused by the transfer of the wafer W is corrected by performing position adjustment of the wafer W after the wafer W is carried into the first processing unit 18. In such a case, however, there is a concern that a throughput decrease due to an increase of a processing time, scale-up of the system due to installation of a position adjusting device, and so forth may occur.

Meanwhile, in the substrate processing system 1 according to the first exemplary embodiment, since the position deviation of the wafer W can be suppressed by the attracting members 172 while transferring the wafer W, the wafer W can be held at an appropriate position on the first holding unit 102 of the first processing unit 18. Accordingly, the position adjusting process and the position adjusting device are not necessary, and, thus, the throughput decrease and the scale-up of the system can be suppressed.

Now, a configuration of the wafer holder 270 of the second transfer device 27 will be explained. As depicted in FIG. 12, the wafer holder 270 of the second transfer device 27 includes a main body 271 having an inner circumferential portion; and a plurality of claw portions 272 inwardly protruding from the inner periphery portion of the main body 271 in a radial direction thereof. Here, a diameter of the inner circumferential portion of the main body 271 is larger than that of the wafer W.

The wafer holder 270 holds the wafer W by sustaining the peripheral portion of the wafer W on the claw portions 272. Accordingly, the wafer holder 270 is capable of transferring the wafer W while suppressing the wafer W from being contaminated with attraction marks or the like.

In the substrate processing system 1, the second transfer device 27 transfers a cleaned wafer W, which has undergone through both the bevel cleaning process and the rear surface cleaning process, into the delivery block 4. Thus, in the substrate processing system 1, the second transfer device 27 equipped with the wafer holder 270 which hardly contaminates the cleaned wafer W is disposed in the transfer unit 26 of the second processing block 3L.

As stated above, the transfer devices, which are appropriate for carry-in/out of wafer W in the first processing unit 18 and the second processing unit 28, are different from each other. In the substrate processing system 1, since the processing block 3 is divided into the first processing block 3U and the second processing block 3L, the first transfer device 17 appropriate for the first processing units 18 and the second transfer device 27 appropriate for the second processing units 28 can both be used.

Further, in FIG. 10, though each of the delivery devices 15a and 15b, the first transfer device 17 and the second transfer device 27 is illustrated to have a single wafer holder, the delivery devices 15a and 15b, the first transfer device 17 and the second transfer device 27 may have a plurality of wafer holders, like the main transfer device 13.

<Transfer Flow of Wafer W>

Figure 13:
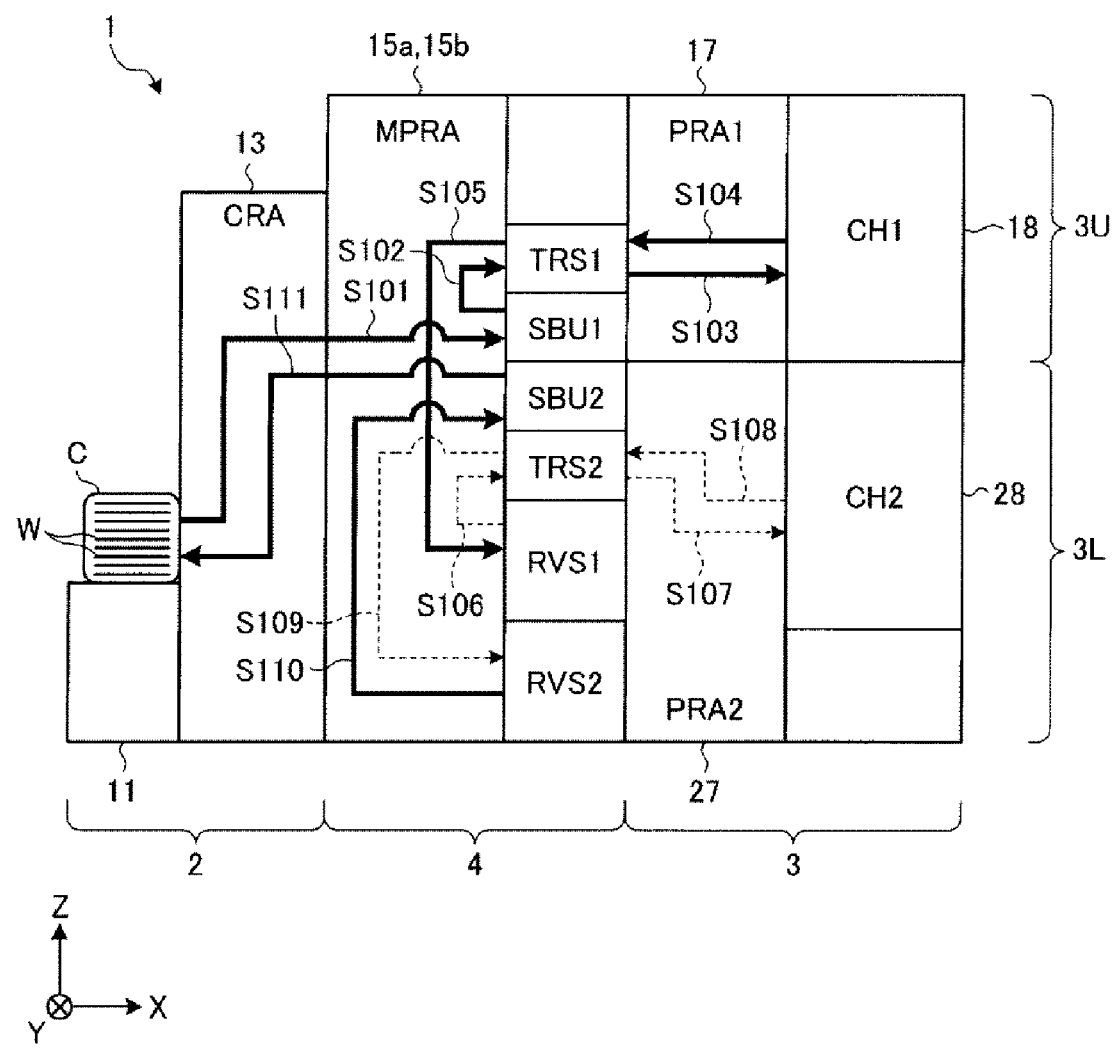
FIG. 13 is a diagram for describing a transfer flow of a wafer in the substrate processing system according to the first exemplary embodiment.

Now, a transfer flow of a wafer W in the substrate processing system 1 according to the first exemplary embodiment will be described with reference to FIG. 13. FIG. 13 is a diagram for describing a transfer flow of the wafer W in the substrate processing system 1 according to the first exemplary embodiment. Further, in FIG. 13, a transfer flow of a wafer W with a front surface facing upward is indicated by a solid line, and a transfer flow of a wafer W with a rear surface facing upward is indicated by a dashed line.

Further, in the following description, the main transfer device 13 may be referred to as "CRA"; the delivery devices 15a and 15b, "MPRA"; the first transfer device 17, "PRA1"; and the second transfer device 27, "PRA2". Further, the first buffer unit 21U will sometimes be referred to as "SBU1"; the second buffer unit 21L, "SBU2"; the first transit unit 22U, "TRS1"; the second transit unit 22L, "TRS2"; the first reversing device 23a, "RVS1"; and the second reversing device 23b, "RVS2". Further, the first processing unit 18 will sometimes be referred to as "CH1"; and the second processing unit 28, "CH2". Further, in FIG. 13, the first buffer unit 21U (SBU1), the second buffer unit 21L (SBU2), the first transit unit 22U (TRS1), the second transit unit 22L (TRS2), the first reversing device 23a (RVS1) and the second reversing device 23b (RVS2) are illustrated while their reference numerals are omitted.

As depicted in FIG. 13, in the substrate processing system 1, the main transfer device 13 (CRA) takes out a plurality of unprocessed wafers W from the cassette C and carries the plurality of unprocessed wafers W into the first buffer unit 21U (SBU1) (process S101).

Thereafter, the delivery device 15a (MPRA) takes out an unprocessed wafer W from the first buffer unit 21U (SBU1) and transports it into the first transit unit 22U (TRS1) (process S102).

Then, the first transfer device 17 (PRA1) of the first processing block 3U takes out the wafer W from the first transit unit 22U (TRS1) and transfers the wafer W into the first processing unit 18 (CH1) (process S103), and the first processing unit 18 (CH1) performs the bevel cleaning process on the wafer W. Upon the completion of the bevel cleaning process, the first transfer device 17 (PRA1) takes out the wafer W on which the bevel cleaning process is completed, i.e., bevel-cleaned wafer W from the first processing unit 18 (CH1) and carries it back into the first transit unit 22U (TRS1) (process S104).

Subsequently, the delivery device 15a (MPRA) takes out the bevel-cleaned wafer W from the first transit unit 22U (TRS1) and carries it into the first reversing device 23a (RVS1) (process S105). The first reversing device 23a (RVS1) reverses the front/rear surfaces of the wafer W. Accordingly, the wafer W is turned into the state where the rear surface thereof faces upward.

Thereafter, the delivery device 15b (MPRA) takes out the wafer W from the first reversing device 23a (RVS1) and carries it into the second transit unit 22L (TRS2) (process S106).

Afterwards, the second transfer device 27 (PRA2) of the second processing block 3L takes out the wafer W from the second transit unit 22L (TRS2) and transfers it into the second processing unit 28 (CH2) (process S107), and the second processing unit 28 (CH2) performs the rear surface cleaning process on the wafer W. Upon the completion of the rear surface cleaning process, the second transfer device 27 (PRA2) takes out the wafer W, on which the rear surface cleaning process is completed, from the second processing unit 28 (CH2) and carries it into the second transit unit 22L (TRS2) (process S108).

The transfers (processes S107 and S108) of the wafer W by the second transfer device 27 and the rear surface cleaning process in the second processing unit 28 are performed in parallel with the transfers (processes S103 and S104) of the wafer W by the first transfer device 17 and the bevel cleaning process in the first processing unit 18. Furthermore, the transfers (processes S103 and S104) of the wafer W by the first transfer device 17 and the transfers (processes S107 and S108) of another wafer W by the second transfer device 27 are performed in parallel with the transfers (processes of S102, S105, S106, S109 and S110) of other wafers W by the delivery devices 15a and 15b (MPRA). Accordingly, the throughput of the series of substrate processings can be improved.

Subsequently, the delivery device 15b (MPRA) takes out the wafer W from the second transit unit 22L (TRS2) and carries it into the second reversing device 23b (RVS2) (process S109). Then, the second reversing device 23b (RVS2) reverses the front/rear surfaces of the wafer W. Accordingly, the wafer W is returned back into the state where the front surface thereof faces upward.

Then, the delivery device 15a (MPRA) takes out the wafer W from the second reversing device 23b (RVS2) and carries it into the second buffer unit 21L (SBU2) (process S110). Then, the main transfer device 13 (CRA) takes out the wafers W, on which the bevel cleaning process and the rear surface cleaning process are completed, from the second buffer unit 21L (SBU2) and carries them into the cassette C (process S111). Then, the series of substrate processings are finished.

As elaborated above, the substrate processing system 1 according to the first exemplary embodiment includes the first processing block 3U, the second processing block 3L, the first reversing device 23a (RVS1) and the second reversing device 23b (RVS2). The first processing block 3U includes the first processing units 18 (CH1) configured to perform a process on a wafer W with the front surface (corresponding to an example of "first surface") facing upward; and the first transfer device 17 (PRA1) configured to carry the wafer W into/from the first processing units 18 (CH1). The second processing block 3L includes the second processing units 28 (CH2) configured to perform a process on the wafer W with the rear surface (corresponding to an example of "second surface"), which is on the opposite side of the front surface, facing upward; and the second transfer device 27 (PRA2) configured to carry the wafer W into/from the second processing units 28 (CH2). The first and second reversing devices 23a and 23b (RVS1 and RVS2) are provided on the transfer path of the wafer W from the first processing block 3U to the second processing block 3L, and serve to reverse the front/rear surfaces of the wafer W.

Therefore, according to the substrate processing system 1 of the first exemplary embodiment, the management of front/rear surface states of wafers W may not be complicated when handling both the wafer W with the front surface facing upward and the wafer W with the rear surface facing upward.

Furthermore, in the substrate processing system 1 according to the first exemplary embodiment, the transfers of the wafers W into/from the first reversing device 23a (RVS1) and the second reversing device 23b (RVS2) are performed by the delivery devices 15a and 15b (MPRA). Accordingly, as compared to a case of performing such transfers of the wafer W by the first transfer device 17 (PRA1) and the second transfer device 27 (PRA2), processing loads on the first transfer device 17 (PRA1) and the second transfer device 27 (PRA2) can be reduced.

In addition, in the substrate processing system 1, the transfers of the wafers W into/from the first reversing device 23a (RVS1) and the second reversing device 23b (RVS2) may be performed by the first transfer device 17 (PRA1) and the second transfer device 27 (PRA2). In such a case, the first reversing device 23a (RVS1) and the second reversing device 23b (RVS2) need to be located at positions accessible by the first transfer device 17 (PRA1) or the second transfer device 27 (PRA2).

Moreover, in the first exemplary embodiment, though the first processing block 3U is provided at the upper level and the second processing block 3L is provided at the lower level, the locations of the first processing block 3U and the second processing block 3L may be reversed.

Second Exemplary Embodiment

<Configuration of Substrate Processing System 1A According to Second Exemplary Embodiment>

Figure 14:
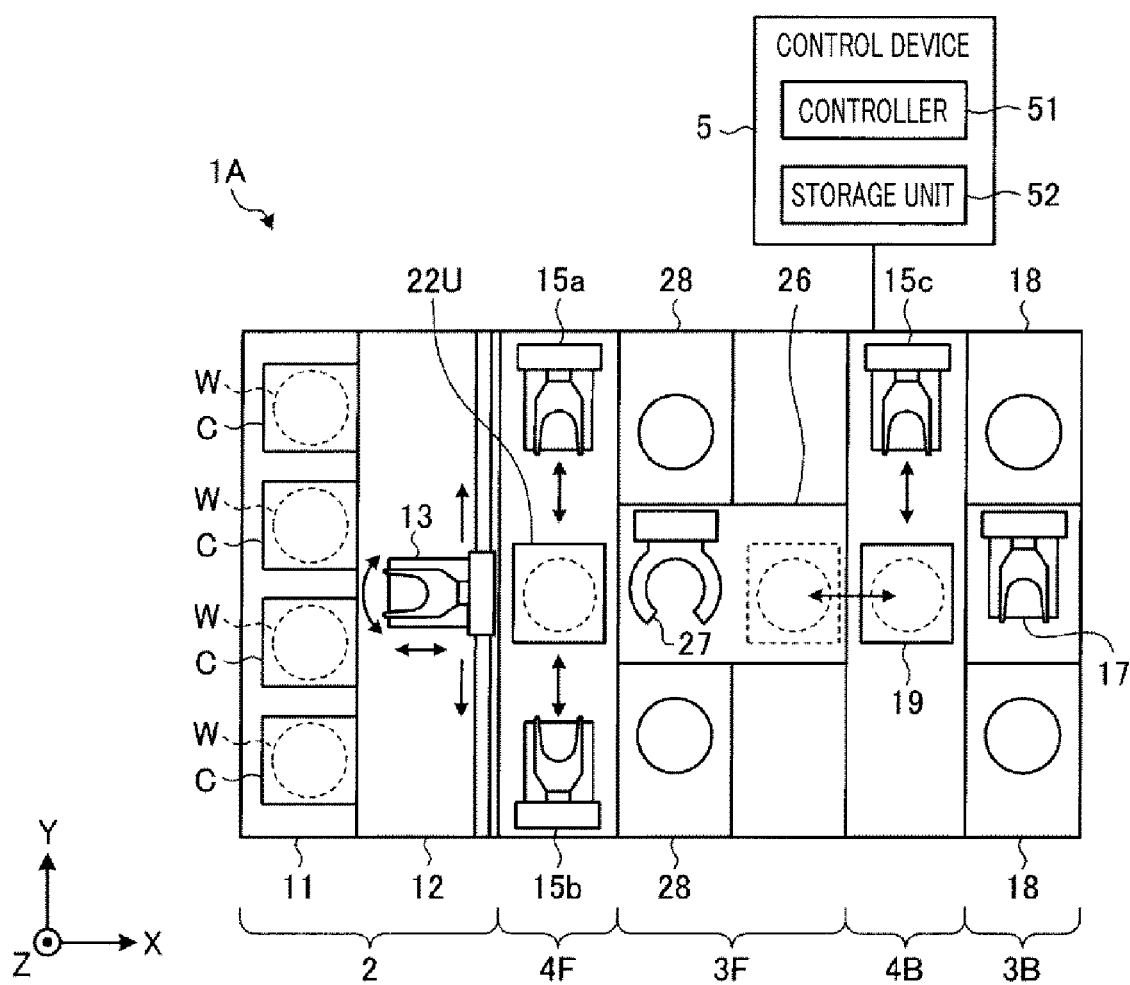
FIG. 14 is a schematic plan view of a substrate processing system according to a second exemplary embodiment.
Figure 15:
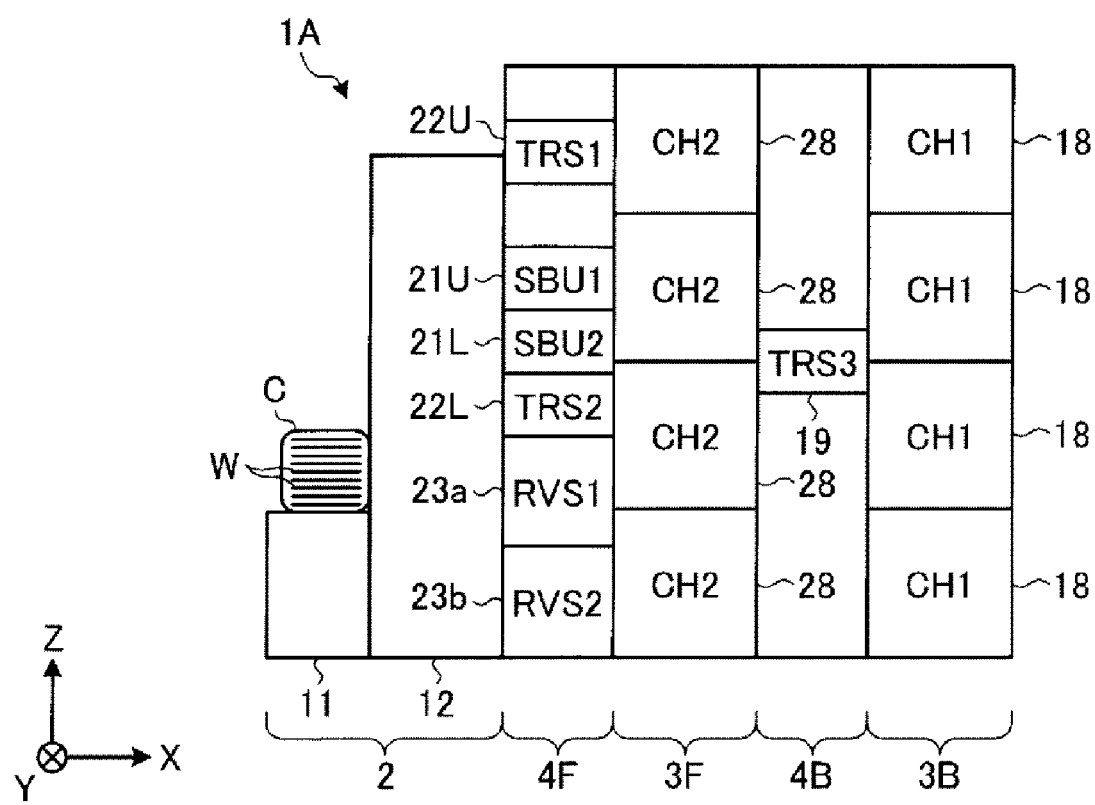
FIG. 15 is a schematic side view of the substrate processing system according to the second exemplary embodiment.

Now, a substrate processing system 1A according to a second exemplary embodiment will be described. First, a configuration of the substrate processing system 1A according to the second exemplary embodiment will be elaborated with reference to FIG. 14 and FIG. 15. FIG. 14 is a schematic plan view of the substrate processing system 1A according to the second exemplary embodiment, and FIG. 15 is a schematic side view of the substrate processing system 1A according to the second exemplary embodiment. In the following description, the same parts as already described above will be assigned same reference numerals, and redundant description will be omitted.

As depicted in FIG. 14, the substrate processing system 1A according to the second exemplary embodiment includes a carry-in/out block 2, a first processing block 3B, a second processing block 3F, a first delivery block 4F and a second delivery block 4B. These blocks are arranged in the order of the carry-in/out block 2, the first delivery block 4F, the second processing block 3F, the second delivery block 4B and the first processing block 3B.

Since the carry-in/out block 2 and the first delivery block 4F have the same configurations as those of the carry-in/out block 2 and the delivery block 4 of the first exemplary embodiment, description thereof will be omitted here.

<Configuration of First Processing Block 3B>

The first processing block 3B is provided at the back side of the second delivery block 4B, that is, at the rearmost section of the substrate processing system 1A. The first processing block 3B includes a first transfer device 17 and a multiple number of first processing units 18. The first transfer device 17 is configured to transfer a wafer W between the first processing unit 18 and the second delivery block 4B.

The multiple number of first processing units 18 are arranged adjacent to the positive Y-axis side and the negative Y-axis side of the first transfer device 17. As depicted in FIG. 15, the multiple number of first processing units 18 are vertically arranged in a height direction thereof.

<Configuration of Second Processing Block 3F>

The second processing block 3F is arranged between the first delivery block 4F and the second delivery block 4B, and includes a second transfer device 27 and a multiple number of second processing units 28. The second transfer device 27 is configured to transfer a wafer W between the first delivery block 4F and the second processing units 28. Further, the second transfer device 27 is also configured to transfer the wafer W between the first delivery block 4F and the second delivery block 4B.

The multiple number of second processing units 28 are arranged adjacent to the positive Y-axis side and the negative Y-axis side of the second transfer device 27. As depicted in FIG. 15, the multiple number of second processing units 28 are vertically arranged in a height direction thereof.

<Configuration of Second Delivery Block 4B>

The second delivery block 4B is arranged between the second processing block 3F and the first processing block 3B. The second delivery block 4B accommodates therein a delivery device 15c and a third transit unit 19.

The delivery device 15c has the same configuration as those of the above-described delivery devices 15a and 15b, and is disposed at the positive Y-axis side of the third transit unit 19. Here, the second delivery block 4B may not necessarily include the delivery device 15c.

The third transit unit 19 is configured to accommodate therein a plurality of wafers W in multiple levels. Further, the third transit unit 19 is configured to be slidable along the horizontal direction (here, X-axis direction). By being slid in the negative X-axis direction, the third transit unit 19 enters a transfer unit 26 of the second processing block 3F and transfers the wafer W to/from the second transfer device 27. Furthermore, the third transit unit 19 may have the same configuration as those of the first transit unit 22U and the second transit unit 22L.

The substrate processing system 1A according to the second exemplary embodiment is configured as described above. The substrate processing system 1A transfers a wafer W transferred from the carry-in/out block 2 into the first processing block 3B via the first delivery block 4F, the second processing block 3F and the second transfer block 4B, and performs the bevel cleaning process on the wafer W in the first processing block 3B. Thereafter, the substrate processing system 1A returns the wafer W, on which the bevel cleaning process is completed, from the first processing block 3B back into the second delivery block 4B, the second processing block 3F and then the first delivery block 4F. Then, the substrate processing system 1A transfers the wafer W into the second processing block 3F and performs the rear surface cleaning process on the wafer W in the second processing block 3F. Thereafter, the substrate processing system 1A transfers the wafer W, on which the rear surface cleaning process is completed, from the second processing block 3F into the carry-in/out block 2 via the first delivery block 4F, and, then, takes out the wafer W from the carry-in/out block 2 to the outside thereof.

<Transfer Flow of Wafer W>

Figure 16:
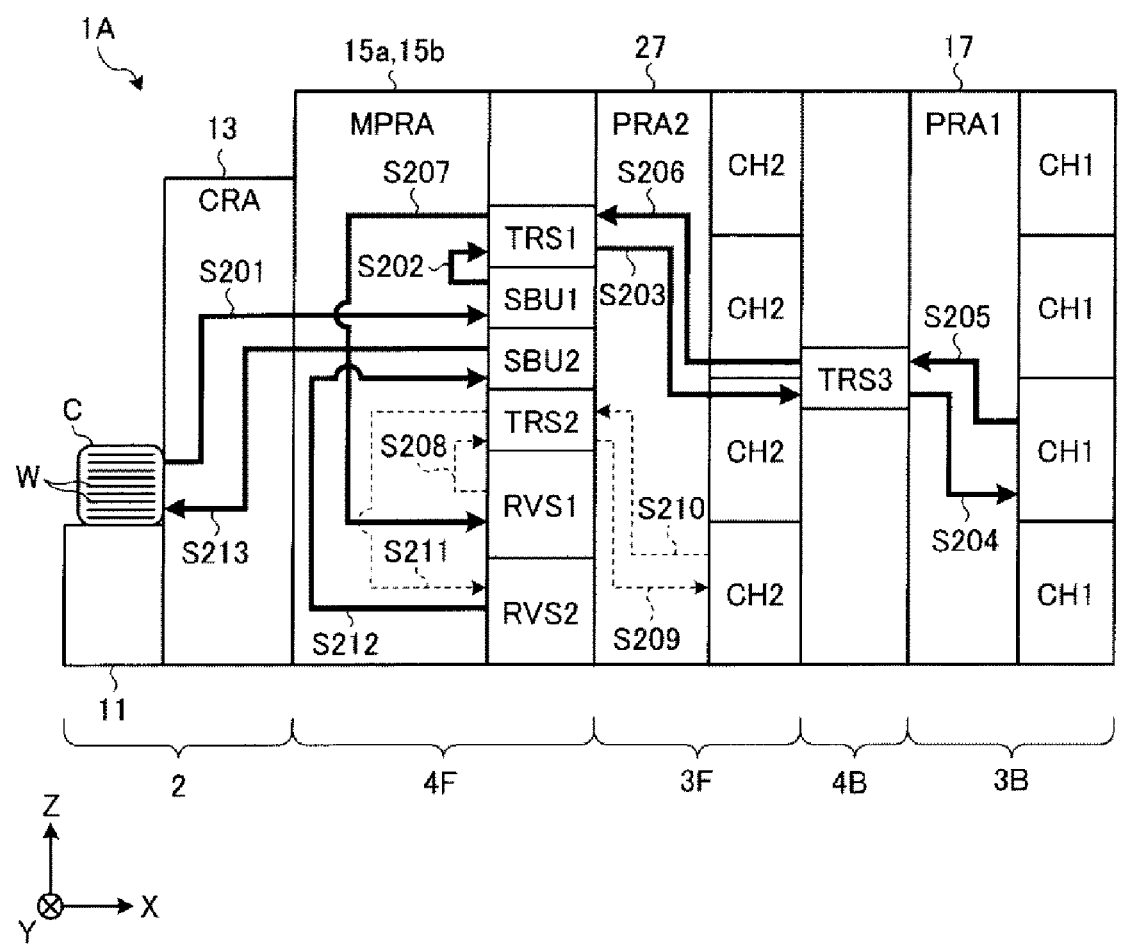
FIG. 16 is a diagram for describing a transfer flow of a wafer in the substrate processing system according to the second exemplary embodiment.

The aforementioned transfer flow of the wafer W will be further elaborated with reference to FIG. 16. FIG. 16 is a diagram for describing the transfer flow of the wafer W in the substrate processing system 1A according to the second exemplary embodiment. In FIG. 16, the third transit unit 19 is referred to as "TRS3". Further, in FIG. 16, a first buffer unit 21U (SBU1), a second buffer unit 21L (SBU2), the first transit unit 22U (TRS1), the second transit unit 22L (TRS2), the third transit unit 19 (TRS3), a first reversing device 23a (RVS1), a second reversing device 23b (RVS2), first processing units 18 (CH1) and second processing units 28 (CH2) are illustrated while their reference numerals are omitted.

Processes S201 and S202 depicted in FIG. 16 are the same as the processes S101 and S102 depicted in FIG. 13, respectively. That is, in the substrate processing system 1A, the main transfer device 13 (CRA) takes out a plurality of unprocessed wafers W from the cassette C and carries the plurality of unprocessed wafers W into the first buffer unit 21U (SBU1) (process S201). Then, the delivery device 15a (MPRA) takes out an unprocessed wafer W from the first buffer unit 21U (SBU1) and carries it into the first transit unit 22U (TRS1) (process S202).

Subsequently, the second transfer device 27 (PRA2) takes out the wafer W from the first transit unit 22U (TRS1) and transfers it into the third transit unit 19 (TRS3) (process S203). Then, the first transfer device 17 (PRA1) takes out the wafer W from the third transit unit 19 (TRS3) and transfers it into the first processing unit 18 (CH1) (process S204), and the first processing unit (CH1) performs the bevel cleaning process on the wafer W.

Upon the completion of the bevel cleaning process, the first transfer device 17 (PRA1) takes out the wafer W, on which the bevel cleaning process is completed, from the first processing unit 18 (CH1) and carries it into the third transit unit 19 (TRS3) (process S205). Then, the second transfer device 27 (PRA2) takes out the wafer W from the third transit unit 19 (TRS3) and carries it into the first transit unit 22U (TRS1) (process S206). The subsequent processes S207 to S213 are the same as the processes S105 to S111 shown in FIG. 13, and description thereof will be omitted here.

As stated above, the first processing block 3B including the first processing units 18 and the second processing block 3F including the second processing units 28 can be arranged in the horizontal direction, without being limited to the layout where they are arranged in the height direction as in the substrate processing system 1 according to the first exemplary embodiment.

Further, in the substrate processing system 1A according to the second exemplary embodiment, the second processing block 3F is located at a front side than the first processing block 3B, that is, at a position closer to the carry-in/out block 2. With this layout, the first transfer device 17 configured to attract and hold the wafer W need not hold the cleaned wafer W on which the bevel cleaning process and the rear surface cleaning process are completed. Therefore, it is possible to suppress contaminants such as attraction marks or the like from being left on the cleaned wafer W.

Furthermore, in the substrate processing system 1A according to the second exemplary embodiment, both the wafer W with the front surface facing upward and the wafer with the rear surface facing upward are transferred into the second processing block 3F. Since, however, the wafer W with the front surface facing upward just passes through the second processing block 3F, the management of front/rear surface states of the wafers W may not be greatly complicated, as compared to the substrate processing system 1 according to the first exemplary embodiment.

Third Exemplary Embodiment

In the above-described second exemplary embodiment, the first reversing device 23a and the second reversing device 23b are arranged within the first delivery block 4F. However, the arrangement of the first reversing device 23a and the second reversing device 23b is not limited to the above example. In this third exemplary embodiment, a modification example of the arrangement of the first reversing device 23a and the second reversing device 23b will be explained.

Figure 17:
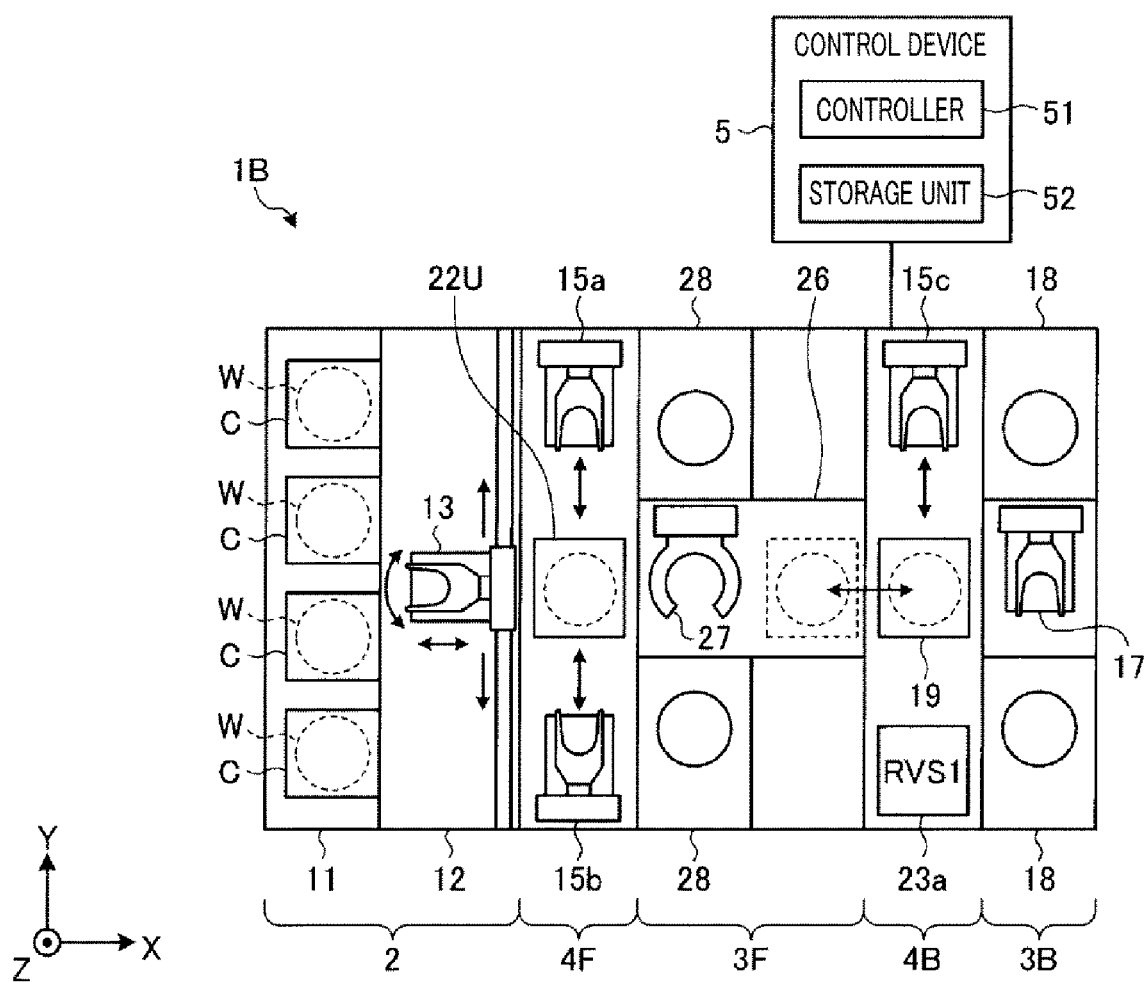
FIG. 17 is a schematic plan view of a substrate processing system according to a third exemplary embodiment.

FIG. 17 is a schematic plan view of a substrate processing system 1B according to the third exemplary embodiment. As shown in FIG. 17, in the substrate processing system 1B according to the third exemplary embodiment, the first reversing device 23a is disposed within the second delivery block 4B, and the second reversing device 23b is disposed within the first delivery block 4F.

Figure 18:
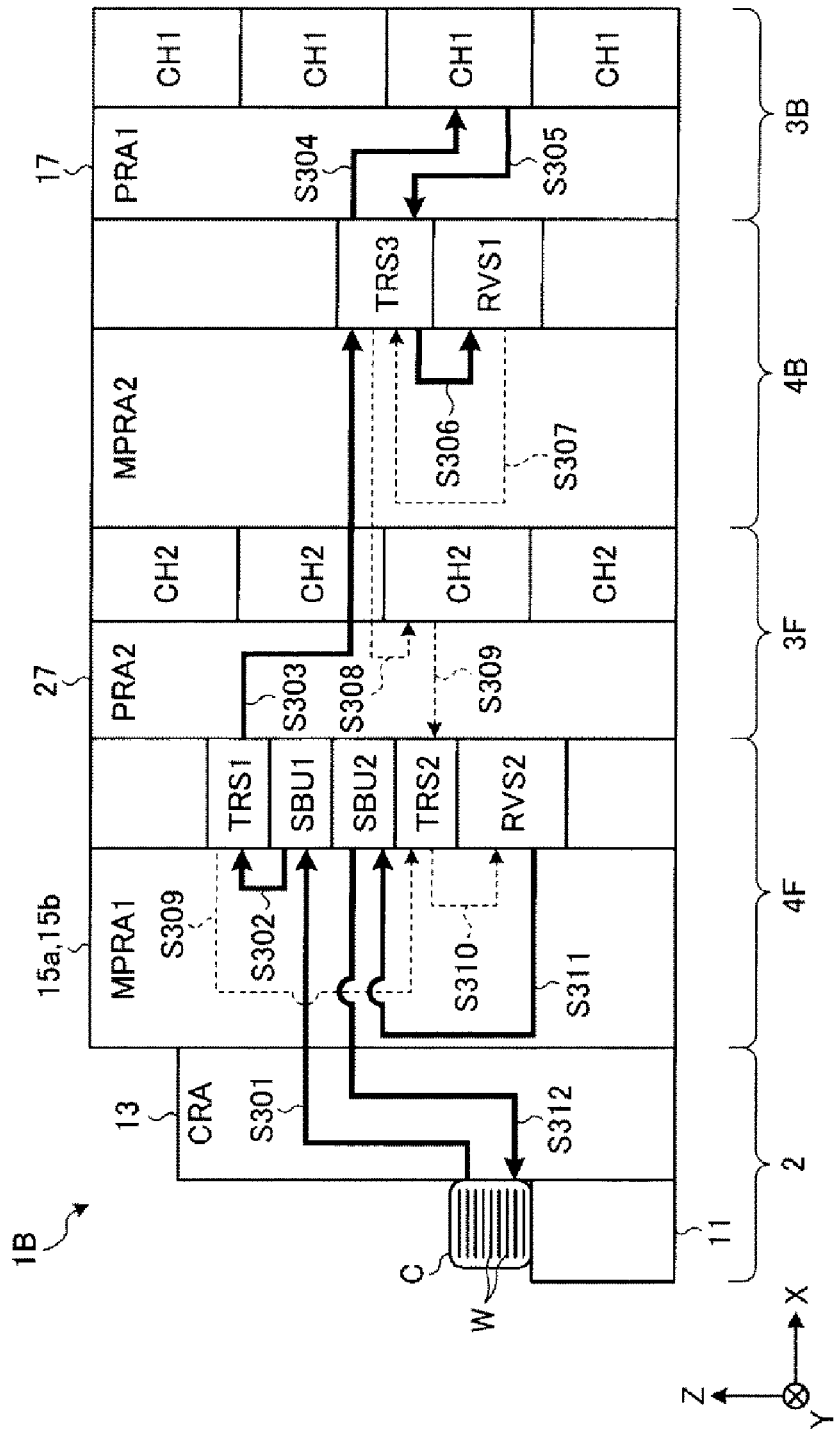
FIG. 18 is a diagram for describing a transfer flow of a wafer in the substrate processing system according to the third exemplary embodiment.

Now, a transfer flow of a wafer W in the substrate processing system 1B according to the third exemplary embodiment will be described with reference to FIG. 18. FIG. 18 is a diagram for describing the transfer flow of the wafer W in the substrate processing system 1B according to the third exemplary embodiment.

Further, in the following description, the delivery devices 15a and 15b provided within the first delivery block 4F will be referred to as "first delivery devices 15a and 15b", and the delivery device 15c provided within the second delivery block 4B will be referred to as "second delivery device 15c". Further, in FIG. 18, the first delivery devices 15a and 15b are referred to as "MPRA1", and the second delivery device 15c is referred to as "MPRA2".

Furthermore, in the same manner as in FIG. 16, the first buffer unit 21U (SBU1), the second buffer unit 21L (SBU2), the first transit unit 22U (TRS1), the second transit unit 22L (TRS2), the third transit unit 19 (TRS3), the first reversing device 23a (RVS1), the second reversing device 23b (RVS2), the first processing units 18 (CH1) and the second processing units 28 (CH2) are illustrated while their reference numerals are omitted.

Processes S301 to S305 depicted in FIG. 18 are the same as the processes S201 to S205 depicted in FIG. 16. Upon the completion of the process S305, the second delivery device 15c (MPRA2) takes out the wafer W from the third transit unit 19 (TRS3) and carries it into the first reversing device 23a (RVS1) (process S306), and the first reversing device 23a (RVS1) reverses the front/rear surfaces of the wafer W. Accordingly, the wafer W is turned into the state where the rear surface thereof faces upward.

Subsequently, the second delivery device 15c (MPRA2) takes out the wafer W from the first reversing device 23a (RVS1) and carries it into the third transit unit 19 (TRS3) (process S307), and the second transfer device 27 (PRA2) takes out the wafer W from the third transit unit 19 (TRS3) and transfers it into the second processing unit 28 (CH2) (process S308). Then, the second processing unit 28 (CH2) performs the rear surface cleaning process on the wafer W.

Upon the completion of the rear surface cleaning process, the second transfer device 27 (PRA2) takes out the wafer W, on which the rear surface cleaning process is completed, from the second processing unit 28 (CH2) and carries it into the second transit unit 22L (TRS2) (process S309). The subsequent processes S310 to S312 are the same as the processes S211 to S213 described in FIG. 16, and description thereof will be omitted here.

As stated above, the first reversing device 23a and the second reversing device 23b may be arranged in the first delivery block 4F and the second delivery block 4B, respectively.

Fourth Exemplary Embodiment

Figure 19:
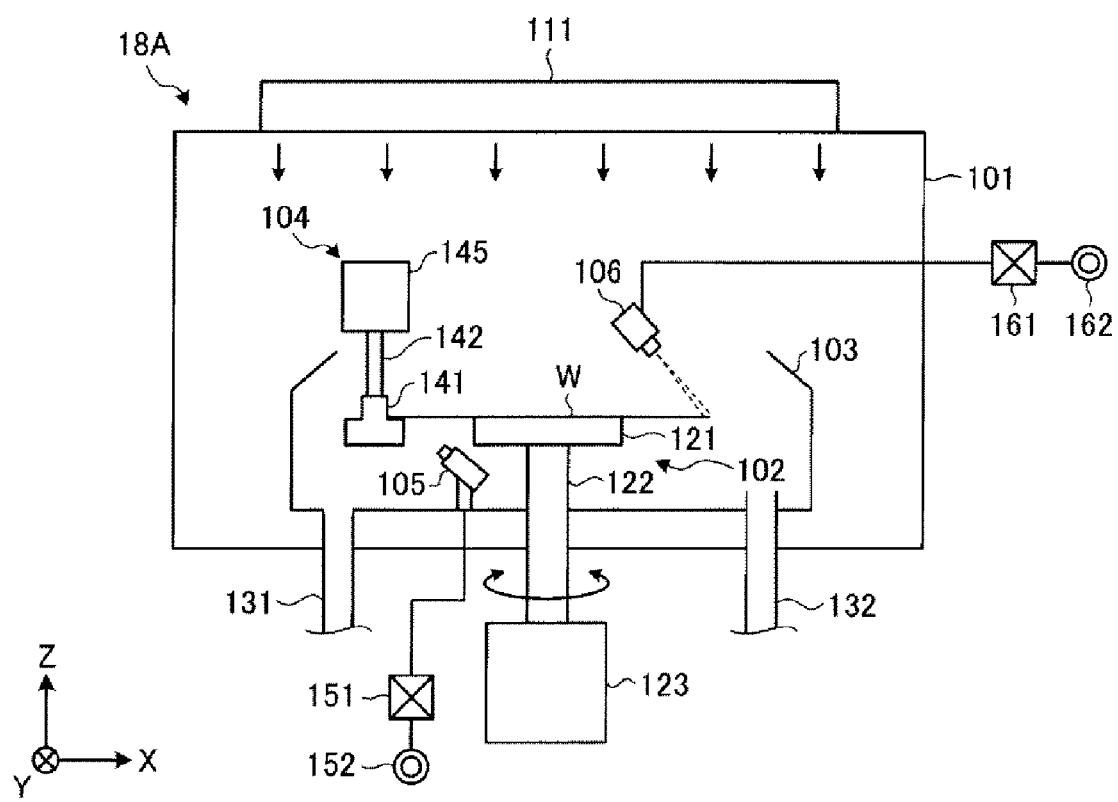
FIG. 19 is a schematic side view of a first processing unit according to a fourth exemplary embodiment.

The above-described exemplary embodiments have been explained for an example case where the bevel cleaning process is performed in the first processing block 3U (3B). However, the substrate processing performed in the first processing block 3U (3B) is not limited to the bevel cleaning process. Thus, in a fourth exemplary embodiment, a modification example of the substrate processing performed in the first processing block 3U (3B) will be described with reference to FIG. 19. FIG. 19 is a schematic side view of a first processing unit 18A according to the fourth exemplary embodiment.

As depicted in FIG. 19, the first processing unit 18A according to the fourth exemplary embodiment further includes a third discharging unit 106. The third discharging unit 106 is connected to an etching liquid supply source 162 via a valve 161, a flow rate controller (not shown), and the like. The third discharging unit 106 is configured to discharge the etching liquid supplied from the etching liquid supply source 162 toward the peripheral portion of the front surface of the wafer W from thereabove, so that a film formed on the peripheral portion of the wafer W is removed.

The first processing unit 18A is configured as described above, and performs an edge-cut process on the wafer W being rotated with the third discharging unit 106 after performing the bevel cleaning process with the bevel cleaning unit 104 and the first discharging unit 105.

As stated above, after the bevel cleaning process and the edge-cut process are performed in the first processing block 3U (3B), the rear surface cleaning process may be performed in the second processing block 3L (3F).

Further, in this fourth exemplary embodiment, though the first processing unit 18A is described to perform both the bevel cleaning process and the edge-cut process, a processing unit configured to perform the bevel cleaning process and a processing unit configured to perform the edge-cut process may be provided within the first processing block 3U (3B) separately.

Fifth Exemplary Embodiment

<Configuration of Substrate Processing System 1C>

Figure 20:
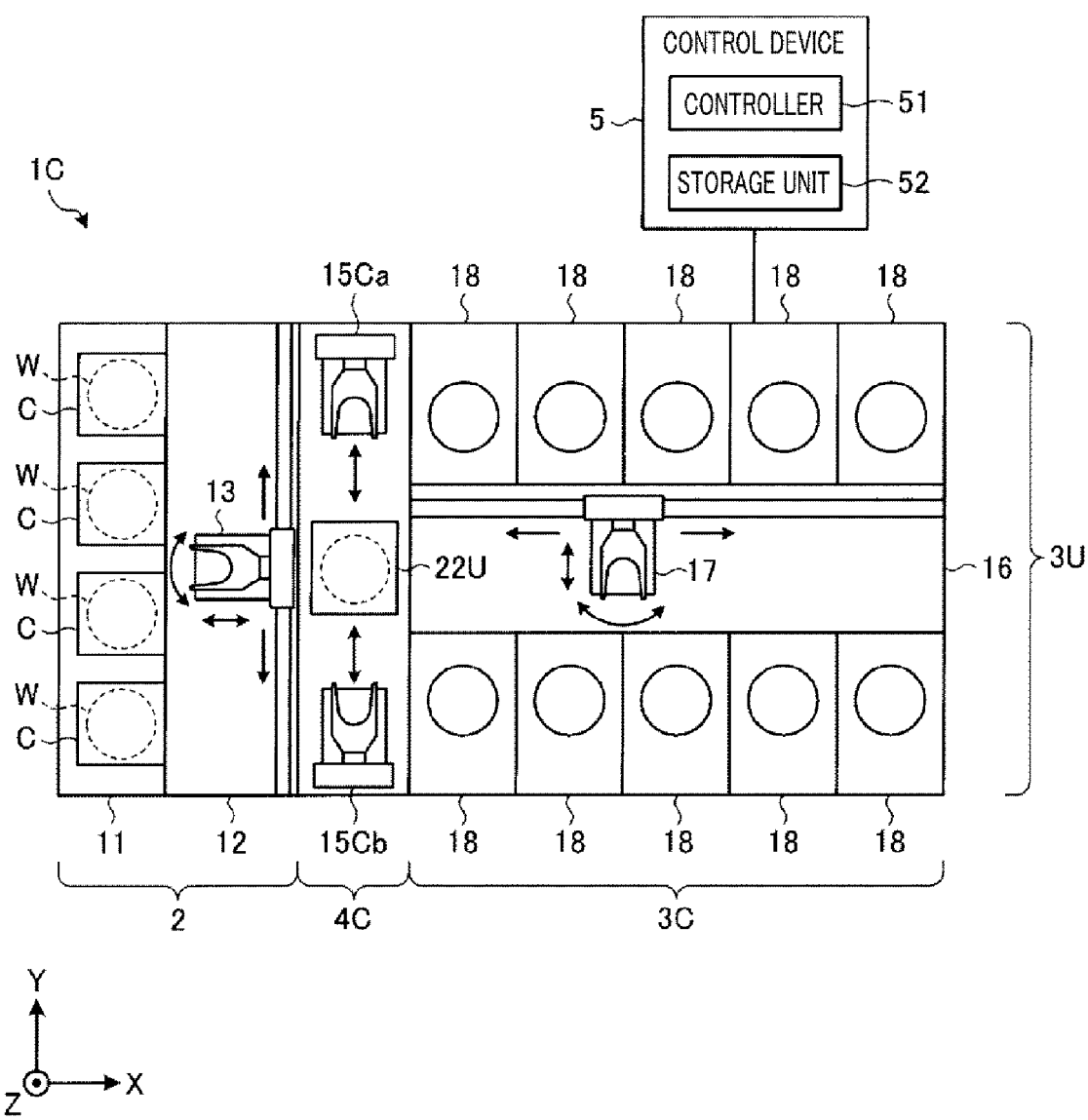
FIG. 20 is a schematic plan view of a substrate processing system according to a fifth exemplary embodiment.

Now, a substrate processing system 1C according to a fifth exemplary embodiment will be explained. FIG. 20 is a schematic plan view of the substrate processing system 1C according to the fifth exemplary embodiment, and FIG. 21 is a schematic side view thereof.

Figure 21:
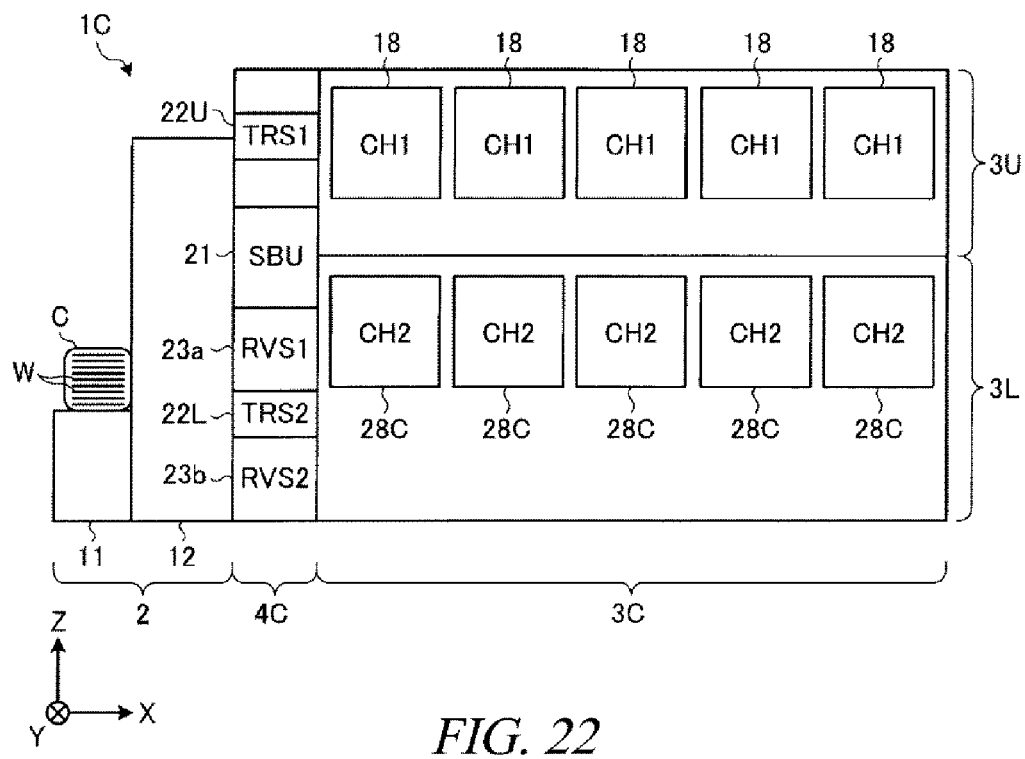
FIG. 21 is a schematic side view of the substrate processing system according to the fifth exemplary embodiment.

As depicted in FIG. 20 and FIG. 21, the substrate processing system 1C according to the fifth exemplary embodiment is different from the substrate processing system 1 of the first exemplary embodiment in that the substrate processing system 1C includes a processing block 3C and a delivery block 4C. The other configurations of the substrate processing system 1C are substantially the same as those of the substrate processing system 1 according to the first exemplary embodiment.

As illustrated in FIG. 21, the processing block 3C includes second processing units 28C. The second processing units 28C are different from the second processing units 28, and are configured to perform a process on the wafer W with the rear surface facing upward and, also, perform a process on the wafer W with the rear surface facing downward (i.e., with the front surface facing upward).

<Configuration of Second Processing Unit 28C>

Figure 22:
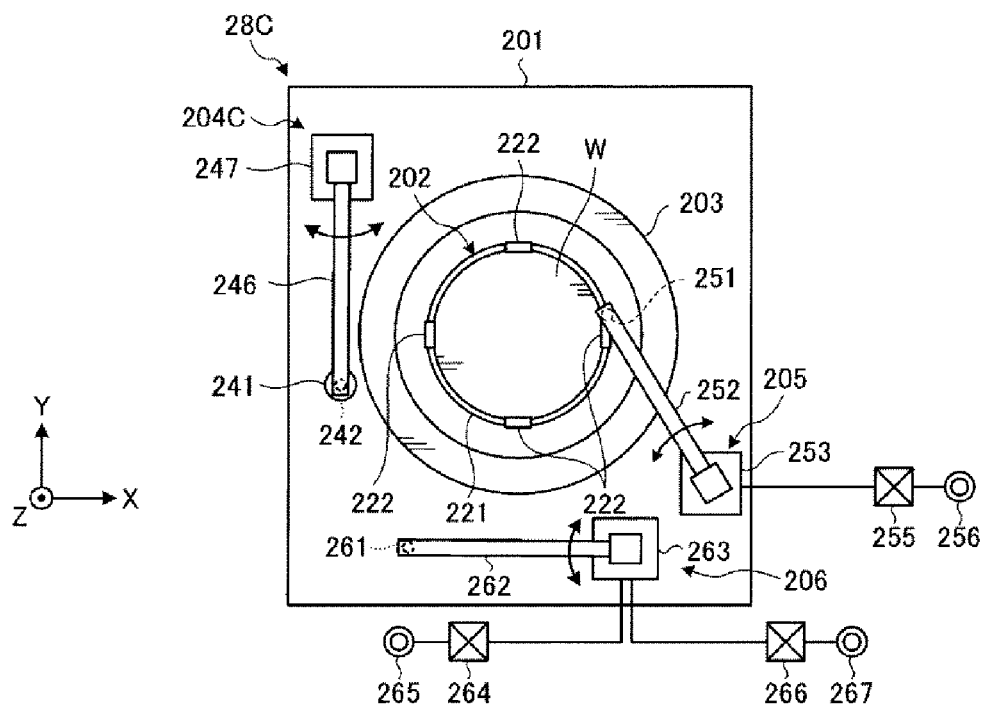
FIG. 22 is a schematic plan view of a second processing unit according to the fifth exemplary embodiment.

Now, a configuration of each second processing unit 28C will be explained with reference to FIG. 22. FIG. 22 is a schematic plan view of the second processing unit 28C according to the fifth exemplary embodiment.

As shown in FIG. 22, the second processing unit 28C includes the second chamber 201, the second holding unit 202, the second recovery cup 203, a rear surface cleaning unit 204C, the second discharging unit 205 and a fourth discharging unit 206. Since the other components except the rear surface cleaning unit 204C and the fourth discharging unit 206 are the same as those of the second processing unit 28, description thereof will be omitted here.

The rear surface cleaning unit 204C includes a rear surface brush 241; an arm 246 extended in the horizontal direction (here, Y-axis direction) and configured to support the rear surface brush 241 from thereabove with a shaft 242 therebetween; and a rotating/elevating device 247 configured to rotate and move the arm 246 up and down. Further, the rear surface cleaning unit 204C further includes a non-illustrating rotating device and is configured to rotate the rear surface brush 241 around the shaft 242 by using the rotating device.

The rear surface cleaning unit 204C and the second discharging unit 205 correspond to an example of a first processing module configured to perform a process on the substrate with the second surface facing upward. Further, the second processing unit 28C may be equipped with, instead of the rear surface cleaning unit 204C, the rear surface cleaning unit 204 provided in the second processing unit 28.

The fourth discharging unit 206 is disposed outside the second recovery cup 203. The fourth discharging unit 206 includes a nozzle 261; an arm 262 horizontally extended and configured to support the nozzle 261; and a rotating/elevating device 263 configured to rotate and move the arm 262 up and down.

The nozzle 261 may be implemented by, but not limited to, a two-fluid nozzle, and is connected to a cleaning liquid supply source 265 via a valve 264, a flow rate controller (not shown), and the like, and also connected to a gas supply source 267 via a valve 266, a flow rate controller (not shown), and the like.

The fourth discharging unit 206 mixes a cleaning liquid (for example, pure water) supplied from the cleaning liquid supply source 265 and a gas (for example, an inert gas such as nitrogen) supplied from the gas supply source 267 within the nozzle 261, and discharges the cleaning liquid in the form of liquid droplets or in the form of mist onto the substrate from the nozzle 261.

The fourth discharging unit 206 corresponds to an example of a second processing module configured to perform a process on the substrate with the first surface facing upward. Here, though the nozzle 261 of the fourth discharging unit 206 is the two-fluid nozzle, for example, the nozzle 261 may be implemented by a typical nozzle.

If the wafer W with the rear surface facing upward is introduced, the second processing unit 28C processes the wafer W with using the rear surface cleaning unit 204C and the second discharging unit 205.

To elaborate, the second processing unit 28C rotates the wafer W with the rear surface facing upward, while holding the peripheral portion of the wafer W by the second holding unit 202. Then, the second processing unit 28C brings the rear surface brush 241 of the rear surface cleaning unit 204C, which is located above the wafer W being rotated, into contact with the wafer W. Furthermore, the second processing unit 28C discharges the cleaning liquid toward the wafer W from the second discharging unit 205 which is disposed above the wafer W being rotated. Then, the second processing unit 28C moves the rear surface brush 241 from the central portion of the wafer W toward the peripheral portion thereof, for example, while rotating the rear surface brush 241. As a result, a particle or the like adhering to the rear surface of the wafer W is removed.

Meanwhile, if the wafer W with the front surface facing upward is introduced, the second processing unit 28C processes the wafer W with the fourth discharging unit 206.

To elaborate, the second processing unit 28C rotates the wafer W with the front surface facing upward, while holding the peripheral portion of the wafer W by the second holding unit 202. Then, the second processing unit 28C locates the nozzle 261 of the fourth discharging unit 206 at a position above the wafer W being rotated and discharges the cleaning liquid in the form of liquid droplets or mist from the nozzle 261 toward the front surface of the wafer W. Accordingly, the front surface of the wafer W is cleaned, and a particle or the like previously attached to the front surface of the wafer W can be removed. Furthermore, in addition to such a previously attached particle, a particle newly adhering to the front surface of the wafer W during, for example, the processing in the first processing unit 18, the rear surface processing in the second processing unit 28C and the transfers of the wafer W can also be removed.

<Configuration of Delivery Block 4C>

Figure 23:
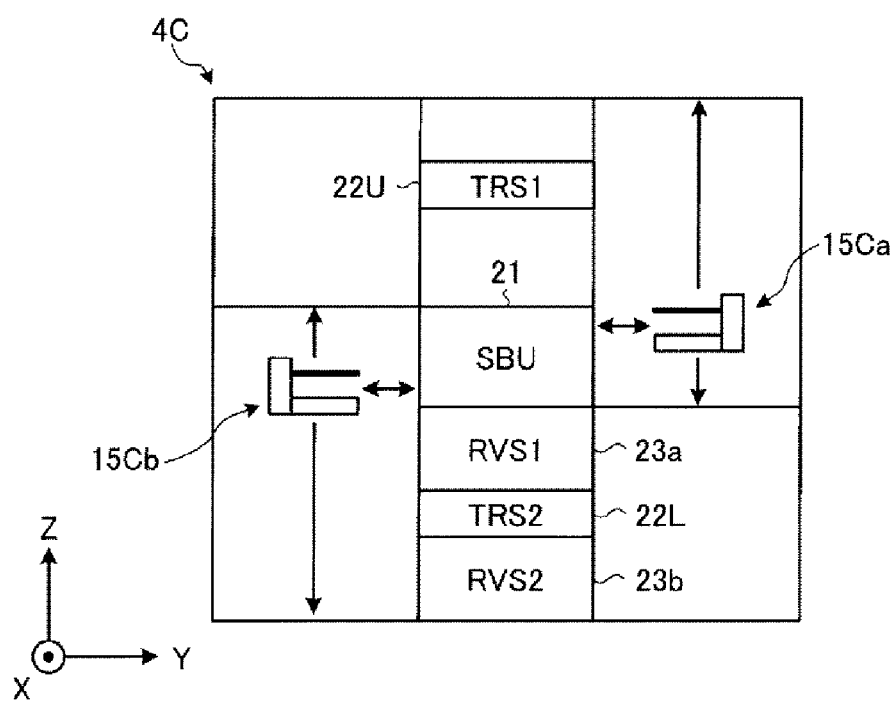
FIG. 23 is a schematic rear view of a delivery block according to the fifth exemplary embodiment.

Now, a configuration of the delivery block 4C will be described with reference to FIG. 20, FIG. 21 and FIG. 23. FIG. 23 is a schematic rear view of the delivery block 4C according to the fifth exemplary embodiment.

As depicted in FIG. 21 and FIG. 23, the first transit unit 22U, the buffer unit 21, the first reversing device 23a, the second transit unit 22L, and the second reversing device 23b are arranged within the delivery block 4C in the height direction in this sequence from the top. Further, as illustrated in FIG. 20 and FIG. 23, a first delivery device 15C*a* and a second delivery device 15C*b* are also provided within the delivery block 4C.

Each of the first delivery device 15C*a* and the second delivery device 15C*b* includes a non-illustrating elevating device, and is configured to transfer a wafer W into/from the first transit unit 22U or other units, which are vertically arranged in the height direction, while being moved in the vertical direction by the elevating device. Further, the first delivery device 15C*a* is disposed at the positive Y-axis side of the first transit unit 22U and the like, and the second delivery device 15C*b* is disposed at the negative Y-axis side of the first transit unit 22U and the like.

As depicted in FIG. 23, the first delivery device 15C*a* is configured to be accessible to the first transit unit 22U and the buffer unit 21. Meanwhile, the second delivery device 15C*b* is accessible to the buffer unit 21, the first reversing device 23a, the second transit unit 22L and the second reversing device 23b.

As stated above, in the delivery block 4C, the buffer unit 21 is disposed at a position accessible by both the first delivery device 15C*a* and the second delivery device 15C*b*.

<Configuration of Buffer Unit 21>

The buffer unit 21 has the same configuration as that of the first buffer unit 21U and the second buffer unit 21L except that the buffer unit 21 is capable of accommodating therein wafers W in a larger number of levels.

Figure 24:
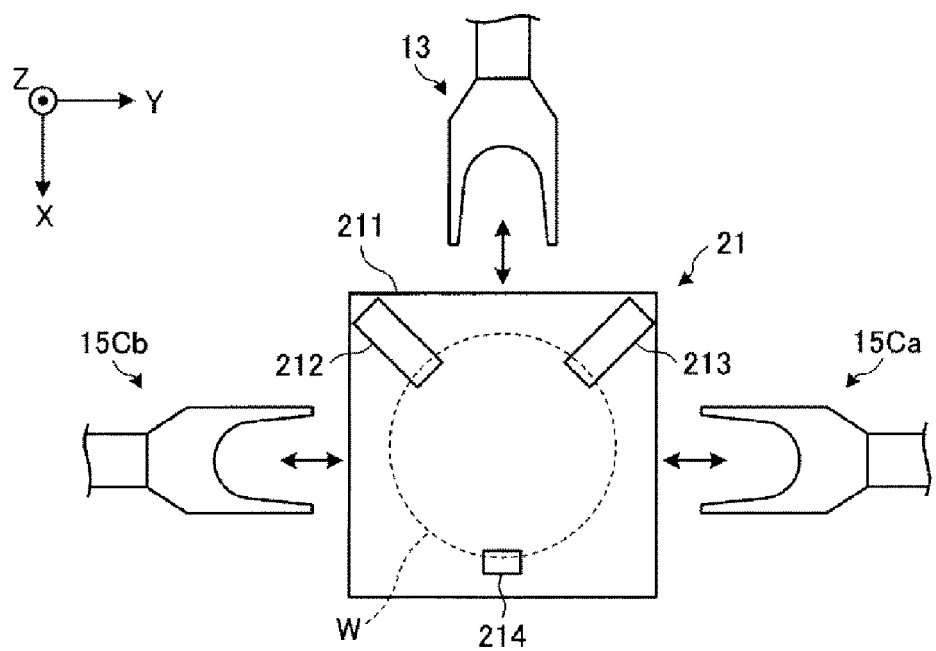
FIG. 24 is a schematic plan view of a buffer unit.

Here, a configuration of the buffer unit 21 will be described with reference to FIG. 24 and FIG. 25. FIG. 24 is a schematic plan view of the buffer unit 21, and FIG. 25 is a schematic side view thereof.

As depicted in FIG. 24, the main transfer device 13, the first delivery device 15C*a* and the second delivery device 15C*b* are configured to access the buffer unit 21 from different directions. To elaborate, the main transfer device 13 advances into the buffer unit 21 through a space between the supporting member 212 and the supporting member 213 from the negative X-axis direction of the buffer unit 21. Further, the first delivery device 15C*a* advances into the buffer unit 21 through a space between the supporting member 213 and the supporting member 214 from the positive Y-axis direction of the buffer unit 21.

Further, the second delivery device 15C*b* enters the buffer unit 21 through a space between the supporting member 212 and the supporting member 214 from the negative Y-axis direction of the buffer unit 21. In the buffer unit 21, the wafer W with the front surface facing upward is accommodated.

Figure 25:
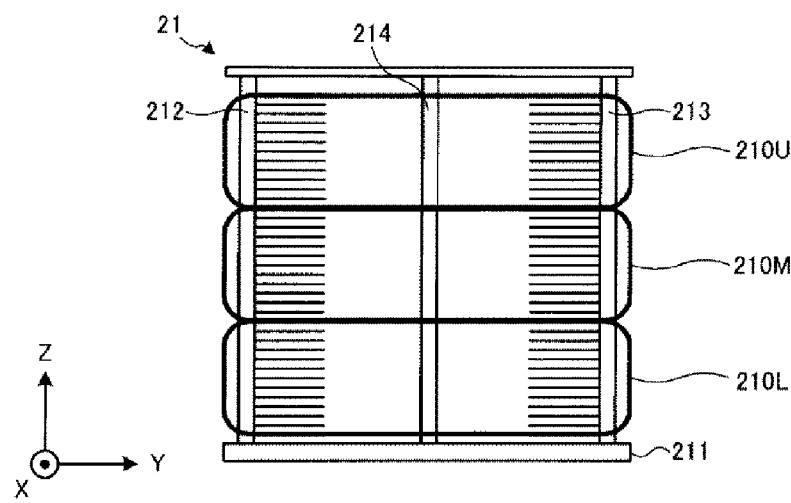
FIG. 25 is a schematic side view of the buffer unit.

As shown in FIG. 25, the buffer unit 21 is divided into three areas: a lower area 210L, a middle area 210M and an upper area 210U, which are arranged in sequence from the bottom. Unprocessed wafers W are accommodated in the lower area 210L. Further, wafers W processed by the first processing unit 18 are accommodated in the middle area 210M, and wafers W processed by both the first processing unit 18 and the second processing unit 28C are accommodated in the upper area 210U.

<Transfer Flow of Wafer W>

Figure 26:
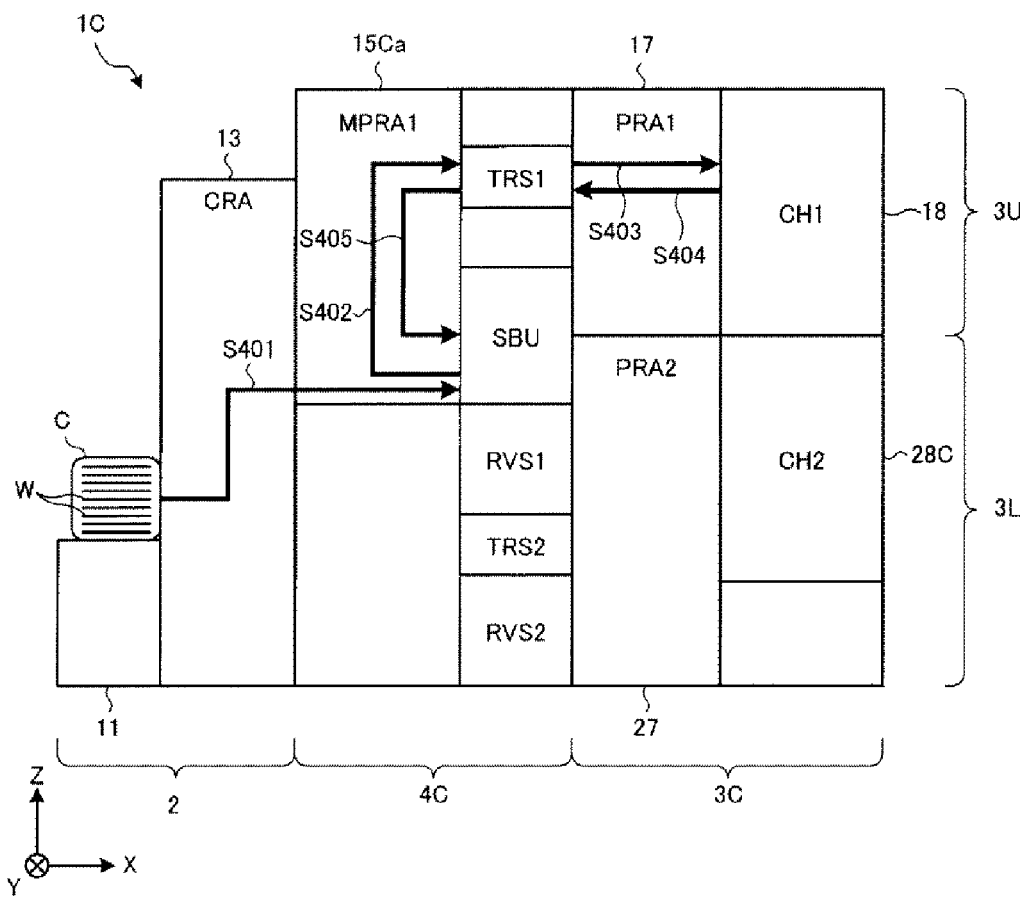
FIG. 26 is a diagram for describing a transfer flow of a wafer W in the substrate processing system according to the fifth exemplary embodiment.
Figure 27:
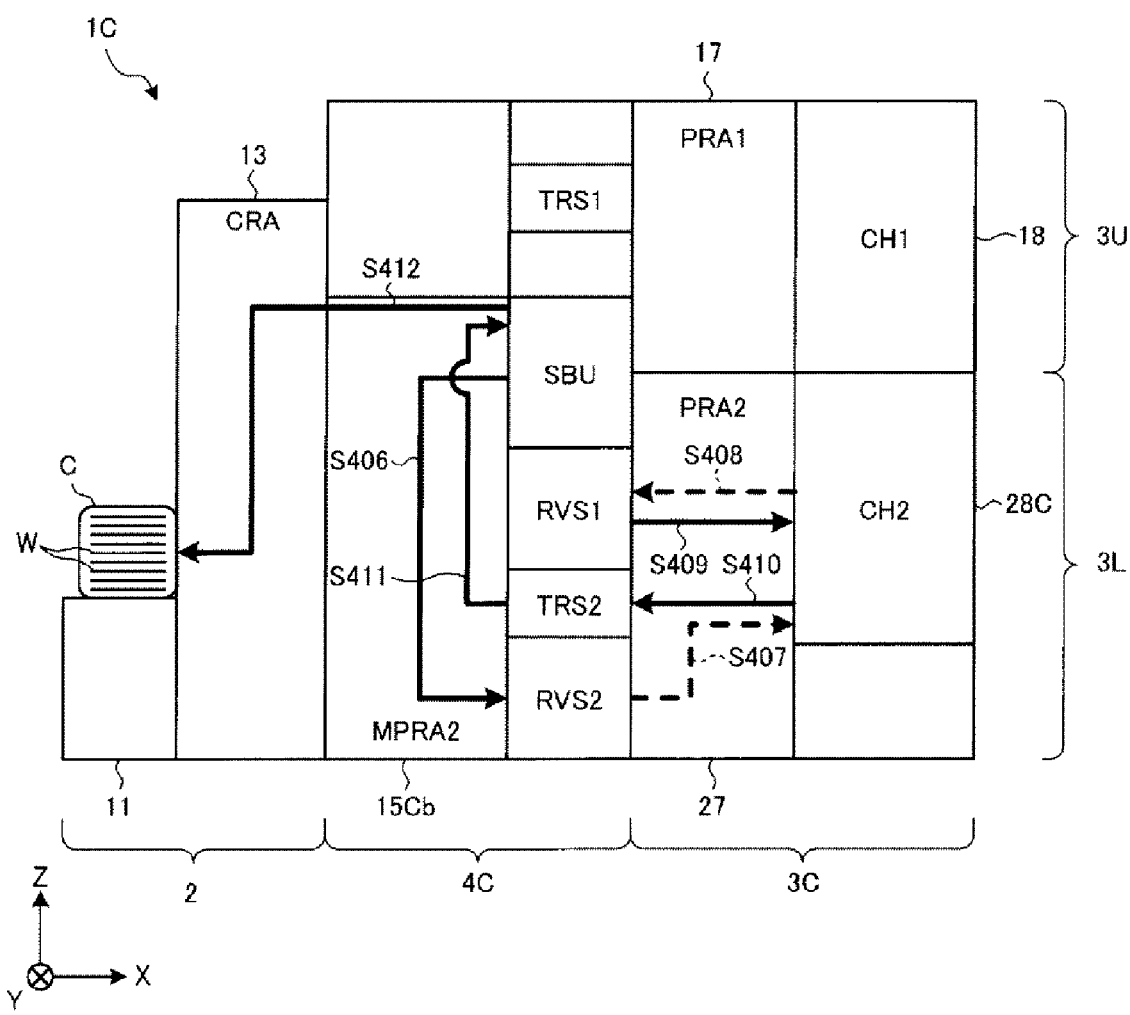
FIG. 27 is a diagram for describing a transfer flow of the wafer W in the substrate processing system according to the fifth exemplary embodiment.

Now, a transfer flow of a wafer W in the substrate processing system 1C according to the fifth exemplary embodiment will be described with reference to FIG. 26 and FIG. 27. FIG. 26 and FIG. 27 is a diagram for describing the transfer flow of the wafer W in the substrate processing system 1C according to the fifth exemplary embodiment.

Further, FIG. 26 shows a transfer flow until before the wafer W is transferred from the first delivery device 15Ca to the second delivery device 15Cb, and FIG. 27 shows a transfer flow after the wafer W is transferred to the second delivery device 15Cb.

Further, in FIG. 26 and FIG. 27, the transfer flow of the wafer W with the front surface facing upward is indicated by a solid line, and the transfer flow of the wafer W with the rear surface facing upward is indicated by a dashed line. Further, in the following description, the first delivery device 15Ca may be referred to as "MPRA1", and the second delivery device 15Cb will be referred to as "MPRA2". Furthermore, in FIG. 26 ad FIG. 27, the buffer unit 21 (SBU), the first transit unit 22U (TRS1), the second transit unit 22L (TRS2), the first reversing device 23a (RVS1) and the second reversing device 23b (RVS2) are illustrated with their reference numerals omitted.

In the substrate processing system 1C according to the fifth exemplary embodiment, the transfer of the wafer W from the first delivery device 15Ca to the second delivery device 15Cb is performed via the buffer unit 21. Further, in the substrate processing system 1C, the second processing unit 28C is configured to perform a process (front surface cleaning process) on the wafer W with the front surface facing upward as well as a process (rear surface cleaning process) on the wafer W with the rear surface facing upward.

As depicted in FIG. 26, in the substrate processing system 1C, the main transfer device 13 (CRA) takes out a plurality of unprocessed wafers W from the cassette C and carries them in the buffer unit 21 (SBU) (process S401). At this time, the main transfer device 13 (CRA) carries the wafers W in the lower area 210L of the buffer unit 21 (SBU).

Subsequently, the first delivery device 15Ca (MPRA1) takes out an unprocessed wafer W from the buffer unit 21 (SBU) and carries it into the first transit unit 22U (TRS1) (process S402).

Thereafter, the first transfer device 17 (PRA1) of the first processing block 3U takes out the wafer W from the first transit unit 22U (TRS1) and transfers the wafer W into the first processing unit 18 (CH1) (process S403), and the first processing unit 18 (CH1) performs the bevel cleaning process on the wafer W. Upon the completion of the bevel cleaning process, the first transfer device 17 (PRA1) takes out the wafer W, on which the bevel cleaning process is completed, from the first processing unit 18 (CH1) and transfers it into the first transit unit 22U (TRS1) (process S404).

Afterwards, the first delivery device 15Ca (MPRA1) carries the wafer W, on which the bevel cleaning process is completed, from the first transit unit 22U (TRS1) into the buffer unit 21 (SBU) (process S405). At this time, the first delivery device 15Ca (MPRA1) carries the wafer W in the middle area 210M of the buffer unit 21 (SBU).

Then, as shown in FIG. 27, the second delivery device 15Cb (MPRA2) takes out the wafer W from the buffer unit 21 (SBU) and transports it into the second reversing device 23b (RVS2) (process S406), and the second reversing device 23b (RVS2) reverses the front/rear surfaces of the wafer W. Thus, the wafer W is turned into a state where the rear surface thereof faces upward.

Subsequently, the second transfer device 27 (PRA2) of the second processing block 3L takes out the wafer W from the second reversing device 23b (RVS2) and transfers the wafer W into the second processing unit 28C (CH2) (process S407). At this time, since the wafer W is held with the rear surface facing upward, the rear surface cleaning process is performed on the wafer W in the second processing unit 28C (CH2) by using the rear surface cleaning unit 204C and the second discharging unit 205. Here, a processing status of each of the second processing units 28C is managed by, for example, the control device 5 in real time, and the wafers W are transferred into empty second processing units 28C in sequence.

Then, upon the completion of the rear surface cleaning process, the second transfer device 27 (PRA2) takes out the wafer W, on which the rear surface cleaning process is completed, from the second processing unit 28C (CH2) and transfers the wafer W into the first reversing device 23a (RVS1) (process S408). The first reversing device 23a (RVS1) reverses the front/rear surfaces of the wafer W. Accordingly, the wafer W is turned into a state where the front surface thereof faces upward.

Thereafter, the second transfer device 27 (PRA2) takes out the wafer W from the first reversing device 23a (RVS1) and transfers it back into the second processing unit 28C (CH2) (process S409). At this time, since the wafer W is held with the front surface facing upward, the front surface cleaning process is performed on the wafer W in the second processing unit 28C (CH2) by using the fourth discharging unit 206. Here, a processing status of each of the processing units 28C is managed by, for example, the control device 5 in real time, and the wafers W are transferred in sequence into the second processing units which are empty after the previous rear surface cleaning process is finished.

Then, if the front surface cleaning process is finished, the second transfer device 27 (PRA2) takes out the wafer W, on which the front surface cleaning process is completed, from the second processing unit 28C (CH2) and transfers it into the second transit unit 22L (TRS2) (process S410). Then, the second delivery device 15Cb (MPRA2) takes out the wafer W from the second transit unit 22L (TRS2) and transports it into the buffer unit 21 (SBU) (process S411). At this time, the second delivery device 15Cb (MPRA2) carries the wafer W in the upper area 210U of the buffer unit 21 (SBU).

Then, the main transfer device 13 (CRA) takes out a plurality of processed wafers W from the buffer unit 21 (SBU) and carries them in the cassette C (process S412). Through this operation, the series of substrate processings are ended.

With the above-described configuration, since the first delivery device 15Ca and the second delivery device 15Cb handles only a wafer W with the front surface facing upward, the management of surface states of wafers W can be further suppressed from being complicated.

Furthermore, since the transfer of the wafer W from the second delivery device 15Cb to the second transfer device 27 is performed via the second reversing device 23b, instead of the second transit unit 22L, the transfer of the wafer W from the second reversing device 23b to the second transit unit 22L is omitted. Thus, efficiency of the series of substrate processings can be improved.

Moreover, the first delivery device 15Ca is configured to access the first transit unit 22U and the buffer unit 21 while the second delivery device 15Cb is configured to access the buffer unit 21, the first reversing device 23a, the second transit unit 22L and the second reversing device 23b. Thus, the moving distances of the first delivery device 15Ca and the second delivery device 15Cb can be shortened. Therefore, the efficiency of the series of substrate processings can be improved.

Figure 28:
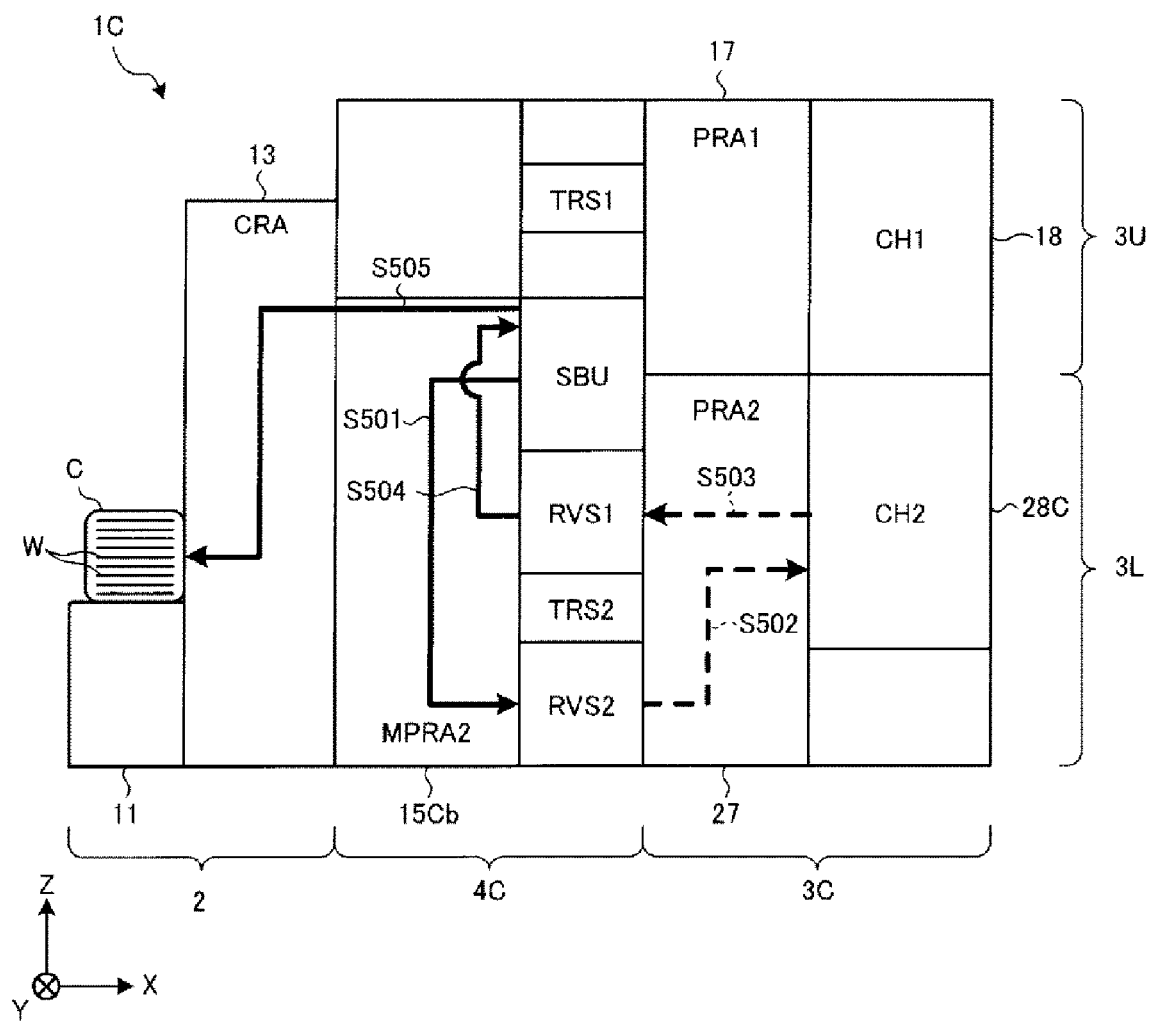
FIG. 28 is a diagram for describing a transfer flow of the wafer when a front surface cleaning process is not performed thereon.

In addition, here, each of the second processing units 28C is configured to perform the process (front surface cleaning process) on the wafer W with the front surface facing upward as well as the process (rear surface cleaning process) on the wafer W with the rear surface facing upward. However, it may be also possible to previously set each second processing unit 28C to perform either one of these two types of cleaning processes. That is, five of ten second processing units 28C, for example, may be set to perform the rear surface cleaning process, and the other five may be set to perform the front surface cleaning process. The former five processing units may be set as destinations in the process S407, and the latter five processing units may be set as destinations in the process S409. Furthermore, the front surface cleaning process may not necessarily be performed. Here, the transfer flow of the wafer W in the case where the front surface cleaning process is not performed will be explained with reference to FIG. 28. FIG. 28 is a diagram for describing the transfer flow of the wafer W in the case where the front surface cleaning process is not performed.

Upon the completion of processes S401 to S405 depicted in FIG. 26, in the substrate processing system 1C, the second delivery device 15Cb takes out the wafer W from the buffer unit 21 (SBU) and transports it into the second reversing device 23b (RVS2) (process S501), as illustrated in FIG. 28. The second reversing device 23b (RVS2) reverses the front/rear surfaces of the wafer W. Accordingly, the wafer W is turned into a state where the rear surface thereof faces upward.

Thereafter, the second transfer device 27 (PRA2) of the second processing block 3L takes out the wafer W from the second reversing device 23b (RVS2) and transfers the wafer W into the second processing unit 28C (CH2) (process S502). In the second processing unit 28C (CH2), the rear surface cleaning process is performed on the wafer W by using the rear surface cleaning unit 204C and the second discharging unit 205.

Subsequently, upon the completion of the rear surface cleaning process, the second transfer device 27 (PRA2) takes out the wafer W, on which the rear surface cleaning process is completed, from the second processing unit 28C (CH2) and transfers it into the first reversing device 23a (RVS1) (process S503). The first reversing device 23a (RVS1) reverses the front/rear surfaces of the wafer W. Accordingly, the wafer W is turned into a state where the front surface thereof faces upward.

Then, the second delivery device 15Cb (MPRA2) takes out the wafer W, on which the rear surface cleaning process is completed, from the first reversing device 23a (RVS1) and transports it into the buffer unit 21 (SBU) (process S504). Here, the second delivery device 15Cb (MPRA2) carries the wafer W in the upper area 210U of the buffer unit 21 (SBU). Then, the main transfer device 13 (CRA) takes out a plurality of processed wafers W from the buffer unit 21 (SBU) and carries them in the cassette C (process S505). Thus, the series of substrate processings are ended.

As discussed above, the substrate processing system 1C may be configured to carry-out wafer W, on which the rear surface cleaning process is completed, without performing the front surface cleaning process after the rear surface cleaning process. In such a case, the substrate processing system 1C need not be equipped with the second transit unit 22L. Furthermore, the substrate processing system 1C may include second processing units 28 (see FIG. 6 and FIG. 7) instead of the second processing units 28C.

Further, in the present exemplary embodiment, the second delivery device 15Cb carries the wafer W into the second reversing device 23b (process S406), and the second transfer device 27 carries the wafer W into the first reversing device 23a (process S408). However, the exemplary embodiment is not limited thereto, and the second delivery device 15Cb may be configured to carry the wafer W into the first reversing device 23a while the second transfer device 27 may be configured to carry the wafer W into the second reversing device 23b. Furthermore, both the second delivery device 15Cb and the second transfer device 27 may be configured to access only one of the first reversing device 23a and the second reversing device 23b. In such a case, the delivery block 4C need not necessarily be equipped with two reversing devices.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting. The scope of the inventive concept is defined by the following claims and their equivalents rather than by the detailed description of the exemplary embodiments. It shall be understood that all modifications and embodiments conceived from the meaning and scope of the claims and their equivalents are included in the scope of the inventive concept.

I claim:

1. A substrate processing system, comprising:
a first processing block comprising a first processing unit configured to perform a process on a substrate with a first surface of the substrate facing upward, and a first transfer device configured to carry the substrate into/from the first processing unit;
a second processing block comprising a second processing unit configured to perform a process on the substrate with a second surface of the substrate, which is opposite to the first surface, facing upward, and a second transfer device configured to carry the substrate into/from the second processing unit; and
a reversing device provided on a transfer path of the substrate from the first processing block to the second processing block, and configured to reverse the substrate; and
a delivery block comprising a first transit unit provided at a position allowed to be accessed by the first transfer device and configured to accommodate therein the substrate with the first surface facing upward; a second transit unit provided at a position allowed to be accessed by the second transfer device and configured to accommodate therein the substrate with the second surface facing upward; and a delivery device configured to carry the substrate into/from the first transit unit and the second transit unit,
wherein the reversing device is disposed within the delivery block,
the first processing block and the second processing block are arranged in a height direction thereof, the first transit unit and the second transit unit corresponding to the first processing block and the second processing block respectively are arranged in a height direction thereof, the delivery device is different from the first transfer device and the second transfer device, and configured to transfer the substrate into/from the reversing device, and the reversing device being located at a position that is inaccessible by the first and second transfer devices such that the first and second transfer devices do not access the reversing device.

2. The substrate processing system of claim 1, wherein the first processing unit is configured to process a peripheral portion of the substrate while attracting and holding the second surface of the substrate with the first surface as a circuit forming surface facing upward, and the second processing unit is configured to process the second surface of the substrate while holding the peripheral portion of the substrate with the second surface facing upward.

3. The substrate processing system of claim 1, wherein the first transfer device comprises an attracting member configured to attract the substrate, and the first transfer device is configured to transfer the substrate while attracting and holding the second surface of the substrate by using the attracting member, and the second transfer device comprises an inner circumferential portion having a diameter larger than that of the substrate and a plurality of claw portions inwardly protruding from the inner circumferential portion in a radial direction thereof, and the second transfer device is configured to transfer the substrate while placing the peripheral portion of the substrate on the claw portions.

4. The substrate processing system of claim 1, wherein the delivery device transfers the substrate with the first surface facing upward into the first transit unit, the first transfer device takes out the substrate from the first transit unit and transfers the substrate into the first processing unit, and, also, the first transfer device takes out the substrate processed by the first processing unit from the first processing unit and transfers the substrate into the first transit unit, the delivery device takes out the substrate from the first transit unit and transfers the substrate into the reversing device, and, also, the delivery device takes out the substrate reversed by the reversing device from the reversing device and transfers the substrate into the second transit unit, and the second transfer device takes out the substrate from the second transit unit and transfers the substrate into the second processing unit.

5. The substrate processing system of claim 1, wherein transfers of the substrate by the first transfer device, the second transfer device and the delivery device are performed in parallel.

6. The substrate processing system of claim 1, wherein the first transit unit, the second transit unit and the reversing device are arranged in the height direction.

7. The substrate processing system of claim 1, wherein the process by the first processing unit and the process by the second processing unit are performed in parallel.

8. A substrate processing system, comprising:

a first processing block comprising a first processing unit configured to perform a process on a substrate with a first surface of the substrate facing upward, and a first transfer device configured to carry the substrate into/from the first processing unit;

a second processing block comprising a second processing unit configured to perform a process on the substrate with a second surface of the substrate, which is opposite to the first surface, facing upward, and a second transfer device configured to carry the substrate into/from the second processing unit;

a reversing device provided on a transfer path of the substrate from the first processing block to the second processing block, and configured to reverse the substrate;

a first delivery block, arranged adjacent to the second processing block, comprising a first transit unit provided at a position allowed to be accessed by the second transfer device and configured to accommodate therein the substrate with the first surface facing upward; a second transit unit provided at a position allowed to be accessed by the second transfer device and configured to accommodate therein the substrate with the second surface facing upward; and a delivery device configured to carry the substrate into/from the first transit unit and the second transit unit; and a second delivery block comprising a third transit unit provided at a position allowed to be accessed by the first transfer device and the second transfer device and configured to accommodate therein the substrate with the first surface facing upward or the substrate with the second surface facing upward, wherein the reversing device is disposed within the first delivery block, the first processing block and the second processing block are arranged in a height direction thereof, the first transit unit and the second transit unit corresponding to the first processing block and the second processing block respectively are arranged in a height direction thereof, the delivery device is different from the first transfer device and the second transfer device, and configured to transfer the substrate into/from the reversing device, the reversing device being located at a position that is inaccessible by the first and second transfer devices such that the first and second transfer devices do not access the reversing device.

9. The substrate processing system of claim 8, wherein the delivery device transfers the substrate with the first surface facing upward into the first transit unit, the second transfer device takes out the substrate from the first transit unit and transfers the substrate into the third transit unit, the first transfer device takes out the substrate from the third transit unit and transfers the substrate into the first processing unit, and, also, the first transfer device takes out the substrate processed by the first processing unit from the first processing unit and transfers the substrate into the third transit unit, the second transfer device takes out the substrate from the third transit unit and transfers the substrate into the first transit unit, the delivery device takes out the substrate from the first transit unit and transfers the substrate into the reversing device, and, also, the delivery device takes out the substrate reversed by the reversing device from the reversing device and transfers the substrate into the second transit unit, and the second transfer device takes out the substrate from the second transit unit and transfers the substrate into the second processing unit.

10. A substrate processing system, comprising:

a first processing block comprising a first processing unit configured to perform a process on a substrate with a first surface of the substrate facing upward, and a first transfer device configured to carry the substrate into/from the first processing unit;

a second processing block comprising a second processing unit configured to perform a process on the substrate with a second surface of the substrate, which is opposite to the first surface, facing upward, and a second transfer device configured to carry the substrate into/from the second processing unit;

a reversing device provided on a transfer path of the substrate from the first processing block to the second processing block, and configured to reverse the substrate;

a first delivery block, arranged adjacent to the second processing block, comprising a first transit unit provided at a position allowed to be accessed by the second transfer device and configured to accommodate therein the substrate with the first surface facing upward; a second transit unit provided at a position allowed to be accessed by the second transfer device and configured to accommodate therein the substrate with the second surface facing upward; and a first delivery device configured to carry the substrate into/from the first transit unit and the second transit unit; and a second delivery block comprising a third transit unit provided at a position allowed to be accessed by the first transfer device and the second transfer device and configured to accommodate therein the substrate with the first surface facing upward or the substrate with the second surface facing upward; and a second delivery device configured to transfer the substrate into/from the third transit unit, wherein the reversing device is disposed within the second delivery block, the first processing block and the second processing block are arranged in a height direction thereof, the first transit unit and the second transit unit corresponding to the first processing block and the second processing block respectively are arranged in a height direction thereof, the second delivery device is different from the first transfer device and the second transfer device, and configured to transfer the substrate into/from the reversing device, and the reversing device being located at a position that is inaccessible by the first and second transfer devices such that the first and second transfer devices do not access the reversing device.

11. The substrate processing system of claim 10, wherein the first delivery device transfers the substrate with the first surface facing upward into the first transit unit, the second transfer device takes out the substrate from the first transit unit and transfers the substrate into the third transit unit, the first transfer device takes out the substrate from the third transit unit and transfers the substrate into the first processing unit, and, also, the first transfer device takes out the substrate processed by the first processing unit from the first processing unit and transfers the substrate into the third transit unit, the second delivery device takes out the substrate from the third transit unit and transfers the substrate into the reversing device, and, also, the second delivery device takes out the substrate reversed by the reversing device from the reversing device and transfers the substrate into the third transit unit, and the second transfer device takes out the substrate from the third transit unit and transfers the substrate into the second processing unit.

12. The substrate processing system of claim 10, wherein transfers of the substrate by the first transfer device, the second transfer device, the first delivery device and the second delivery device are performed in parallel.

13. A substrate processing system, comprising:

a first processing block comprising a first processing unit configured to perform a process on a substrate with a first surface of the substrate facing upward, and a first transfer device configured to carry the substrate into/from the first processing unit;

a second processing block comprising a second processing unit configured to perform a process on the substrate with a second surface of the substrate, which is opposite to the first surface, facing upward, and a second transfer device configured to carry the substrate into/from the second processing unit;

a reversing device provided on a transfer path of the substrate from the first processing block to the second processing block, and configured to reverse the substrate; and a delivery block comprising a first transit unit provided at a position allowed to be accessed by the first transfer device and configured to accommodate therein the substrate with the first surface facing upward; a first delivery device configured to carry the substrate into/from the first transit unit; a second delivery device configured to carry the substrate into/from the reversing device; and a buffer unit provided at a position allowed to be accessed by the first delivery device and the second delivery device and configured to accommodate therein the substrate temporarily, wherein the reversing device is disposed within the delivery block, the first processing block and the second processing block are arranged in a height direction thereof, the first transit unit and a second transit unit corresponding to the first processing block and the second processing block respectively are arranged in a height direction thereof, the second delivery device is different from the first transfer device and the second transfer device, and configured to transfer the substrate into/from the reversing device, and the reversing device being located at a position that is inaccessible by the first and second transfer devices such that the first and second transfer devices do not access the reversing device.

14. The substrate processing system of claim 13, wherein the first delivery device transfers the substrate with the first surface facing upward into the first transit unit, the first transfer device takes out the substrate from the first transit unit and transfers the substrate into the first processing unit, and, also, the first transfer device takes out the substrate processed by the first processing unit from the first processing unit and transfers the substrate into the first transit unit, the first delivery device takes out the substrate from the first transit unit and transfers the substrate into the buffer unit, the second delivery device takes out the substrate from the buffer unit and transfers the substrate into the reversing device, the reversing device reverses the substrate, and the second transfer device takes out the substrate from the reversing device and transfers the substrate into the second processing unit.

15. The substrate processing system of claim 13, wherein the delivery block further comprises a second transit unit provided at a position allowed to be accessed by the second transfer device and configured to accommodate therein the substrate with the first surface facing upward, and the second processing unit comprises a first processing module configured to process the substrate with the second surface facing upward; and a second processing module configured to process the substrate with the first surface facing upward.

16. The substrate processing system of claim 15, wherein the first delivery device transfers the substrate with the first surface facing upward into the first transit unit, the first transfer device takes out the substrate from the first transit unit and transfers the substrate into the first processing unit, and, also, the first transfer device takes out the substrate processed by the first processing unit from the first processing unit and transfers the substrate into the first transit unit, the first delivery device takes out the substrate from the first transit unit and transfers the substrate into the buffer unit, the second delivery device takes out the substrate from the buffer unit and transfers the substrate into the reversing device, the reversing device reverses the substrate, the second transfer device takes out the substrate from the reversing device and transfers the substrate into the second processing unit, the second processing unit performs a process on the substrate by using the first processing module, the second transfer device takes out the substrate from the second processing unit and transfers the substrate into the reversing device, the reversing device reverses the substrate, the second transfer device takes out the substrate from the reversing device and transfers the substrate into the second processing unit, and the second processing unit performs a process on the substrate by using the second processing module.

* * * * *